(12) United States Patent
Minami

(10) Patent No.: US 9,991,145 B2
(45) Date of Patent: Jun. 5, 2018

(54) PLATING APPARATUS AND PLATING METHOD

(71) Applicant: EBARA CORPORATION, Tokyo (JP)

(72) Inventor: Yoshio Minami, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days. days.

(21) Appl. No.: 15/630,119

(22) Filed: Jun. 22, 2017

(65) Prior Publication Data

US 2017/0287761 A1    Oct. 5, 2017

Related U.S. Application Data

(62) Division of application No. 13/277,466, filed on Oct. 20, 2011, now Pat. No. 9,728,435.

(30) Foreign Application Priority Data

| Oct. 21, 2010 | (JP) | ................................ 2010-236524 |
| Nov. 29, 2010 | (JP) | ................................ 2010-264648 |
| Jul. 19, 2011 | (JP) | ................................ 2011-158484 |

(51) Int. Cl.
  *C25D 17/06* (2006.01)
  *H01L 21/677* (2006.01)
  *C25D 17/00* (2006.01)

(52) U.S. Cl.
  CPC ........ *H01L 21/67775* (2013.01); *C25D 17/00* (2013.01); *C25D 17/06* (2013.01); *C25D 17/001* (2013.01)

(58) Field of Classification Search
  CPC ....... C25D 17/00; C25D 17/06; C25D 17/011
  See application file for complete search history.

(56) References Cited

U.S. PATENT DOCUMENTS

| 5,628,828 | A | 5/1997 | Kawamura et al. |
| 6,416,647 | B1 | 7/2002 | Dordi et al. |
| 6,626,736 | B2 * | 9/2003 | Tsujimura ............... B24B 21/04 451/10 |
| 7,022,211 | B2 | 4/2006 | Yoshioka et al. |
| 7,402,227 | B2 | 7/2008 | Yoshioka et al. |
| 2004/0182318 | A1 | 9/2004 | Hashinoki et al. |
| 2006/0141157 | A1 | 6/2006 | Sekimoto et al. |
| 2008/0069672 | A1 | 3/2008 | Ikehata |

(Continued)

FOREIGN PATENT DOCUMENTS

| CN | 101504911 | 8/2009 |
| CN | 101724882 | 6/2010 |
| JP | 58-188241 | 11/1983 |

(Continued)

*Primary Examiner* — Stefanie S Wittenberg
(74) *Attorney, Agent, or Firm* — Wenderoth, Lind & Ponack, L.L.P.

(57) ABSTRACT

A plating apparatus allows a substrate holder to be serviced easily while ensuring easy access to the substrate holder and while a substrate is being processed in the plating apparatus. The plating apparatus includes a plating section for plating a substrate, a substrate holder for holding the substrate, a substrate holder transporter for holding and transporting the substrate holder, a stocker for storing the substrate holder, and a stocker setting section for storing the stocker therein. The stocker includes a moving mechanism for moving the stocker into and out of the stocker setting section.

10 Claims, 33 Drawing Sheets

(56) References Cited

U.S. PATENT DOCUMENTS

| | | |
|---|---|---|
| 2010/0290870 A1 | 11/2010 | Ezure |
| 2010/0320090 A1 | 12/2010 | Yoshioka et al. |

FOREIGN PATENT DOCUMENTS

| | | |
|---|---|---|
| JP | 61-67798 | 4/1986 |
| JP | 63-277798 | 11/1988 |
| JP | 1-272797 | 10/1989 |
| JP | 4-74893 | 3/1992 |
| JP | 6-151677 | 5/1994 |
| JP | 7-316886 | 12/1995 |
| JP | 10-194451 | 7/1998 |
| JP | 11-182699 | 7/1999 |
| JP | 11-204459 | 7/1999 |
| JP | 2001-049495 | 2/2001 |
| JP | 2002-212784 | 7/2002 |
| JP | 2002-220692 | 8/2002 |
| JP | 2002-363794 | 12/2002 |
| JP | 2003-243473 | 8/2003 |
| JP | 2003-277901 | 10/2003 |
| JP | 2004-43936 | 2/2004 |
| JP | 2004-52059 | 2/2004 |
| JP | 2004-76022 | 3/2004 |
| JP | 2004-149894 | 5/2004 |
| JP | 2006-117966 | 11/2006 |
| JP | 3940265 | 4/2007 |
| JP | 4162440 | 8/2008 |
| JP | 2009-006802 | 1/2009 |
| JP | 2009-46724 | 3/2009 |
| JP | 2009/069224 | 6/2009 |
| JP | 2010-18841 | 1/2010 |
| WO | 01/68952 | 9/2001 |
| WO | 2010/054677 | 5/2010 |

* cited by examiner

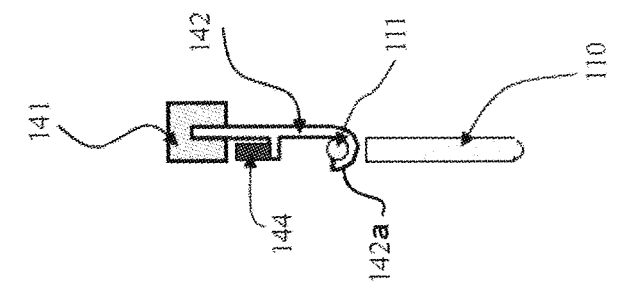
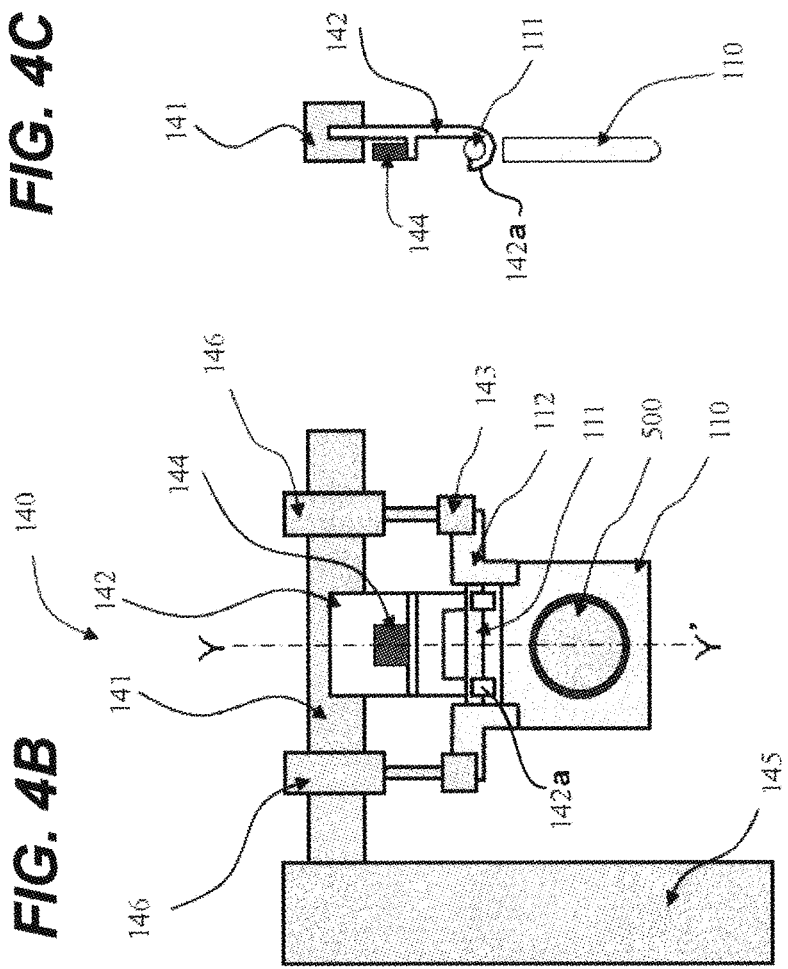
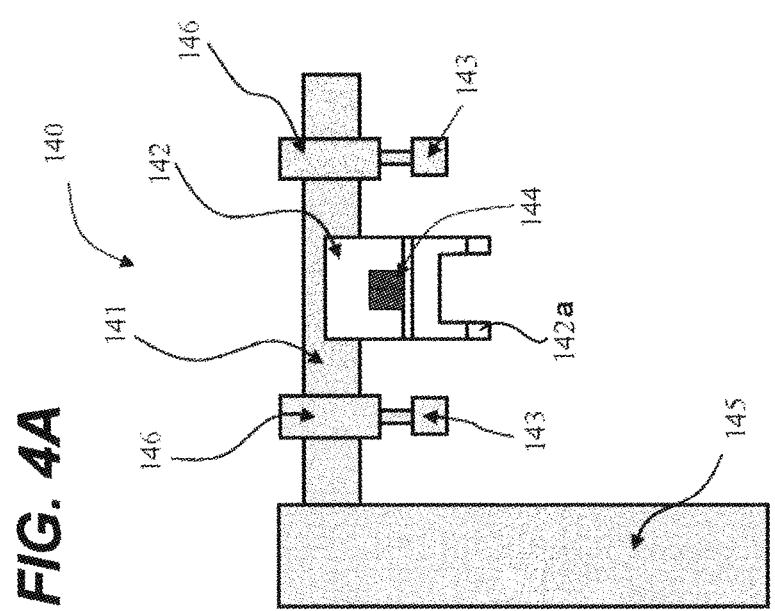

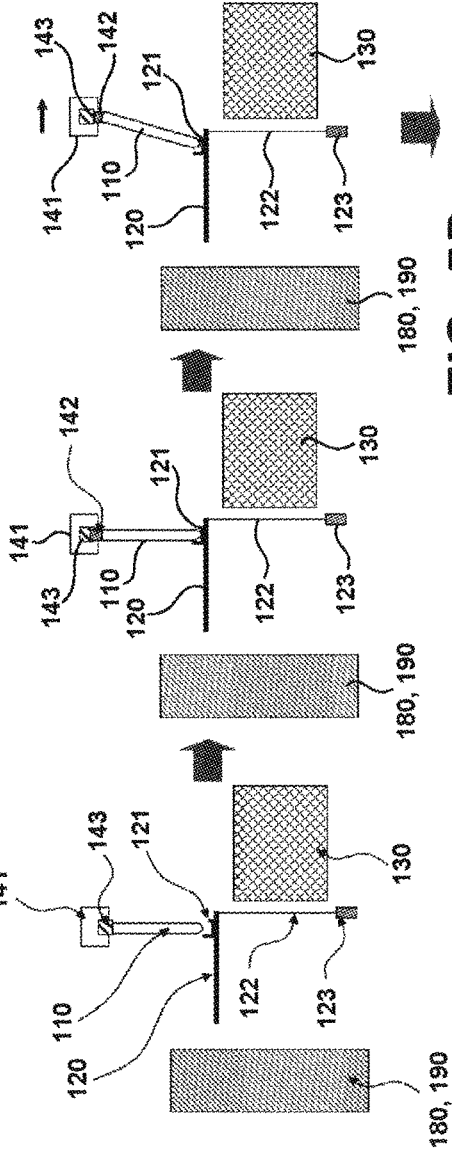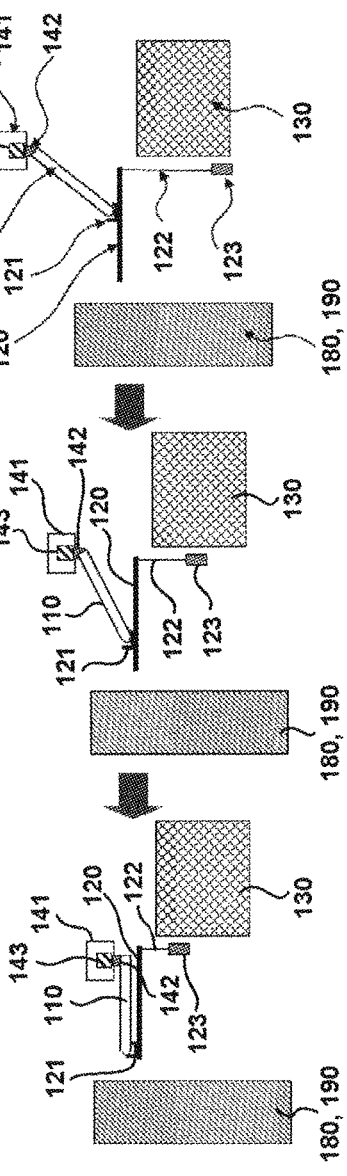

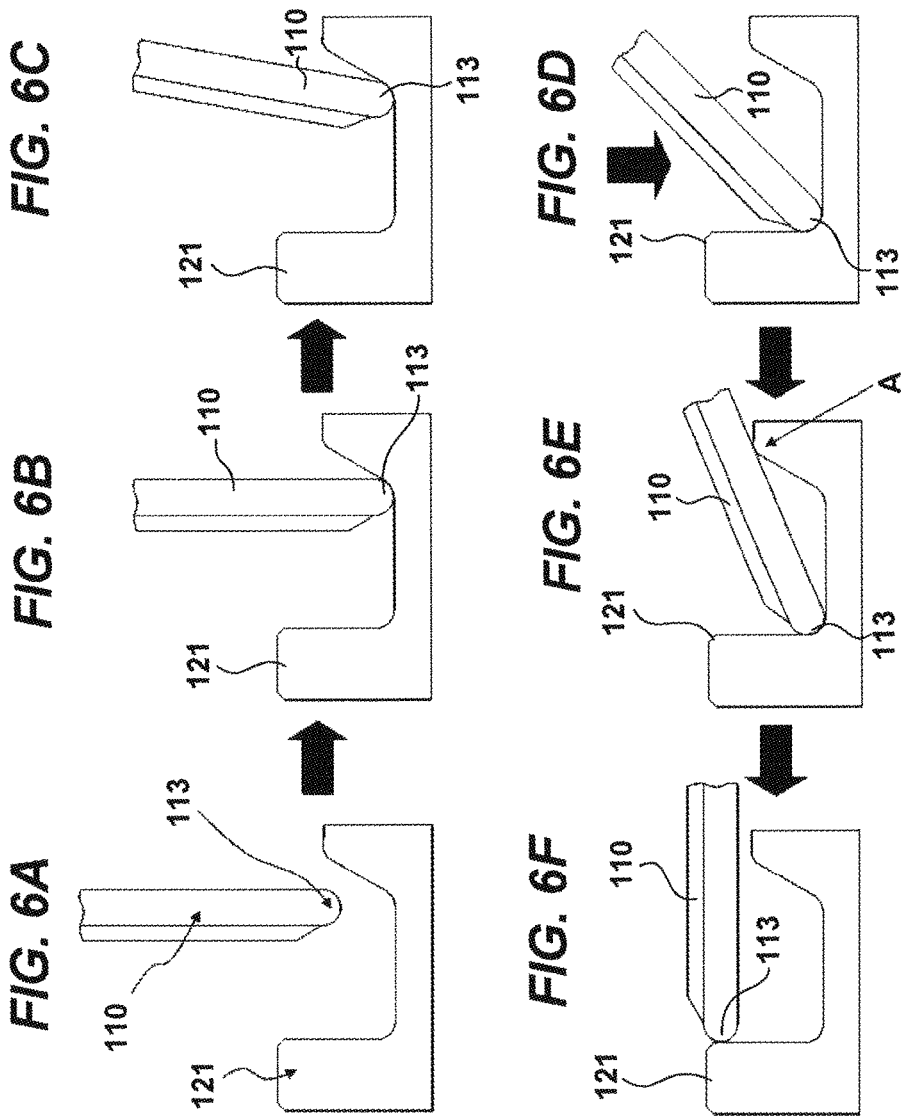

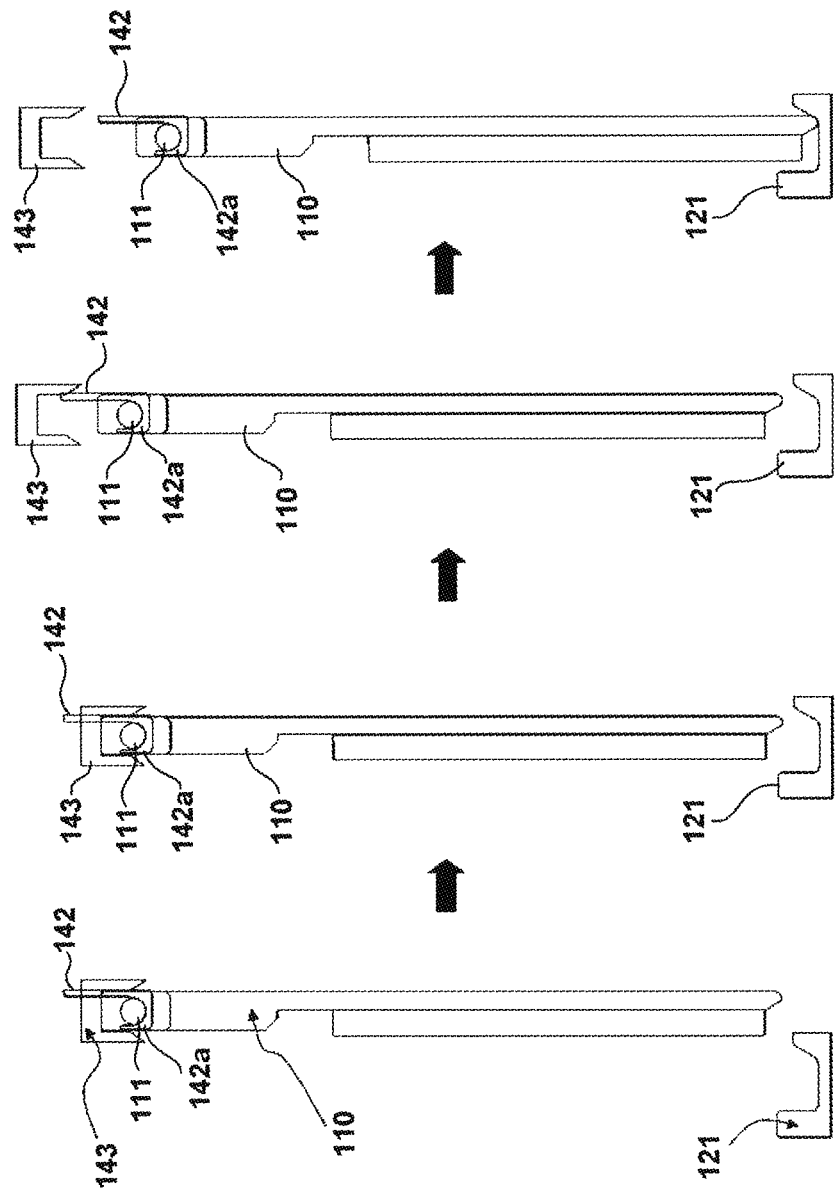

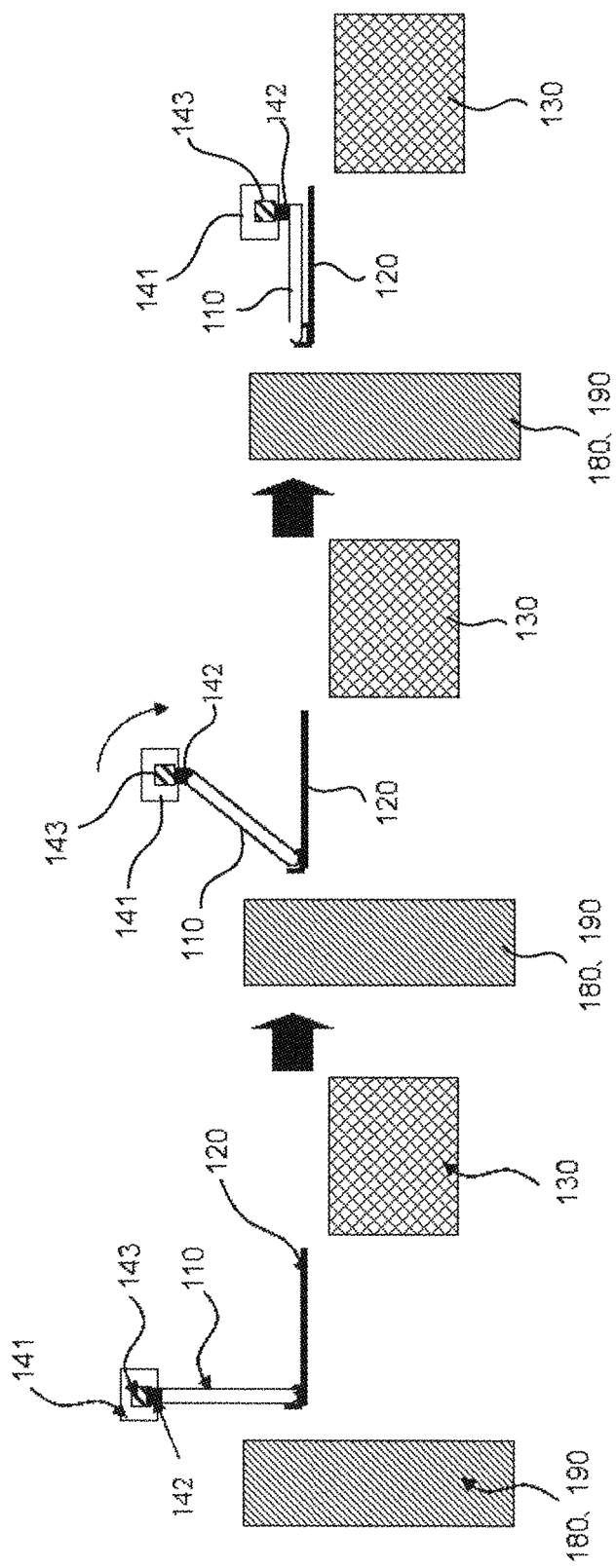

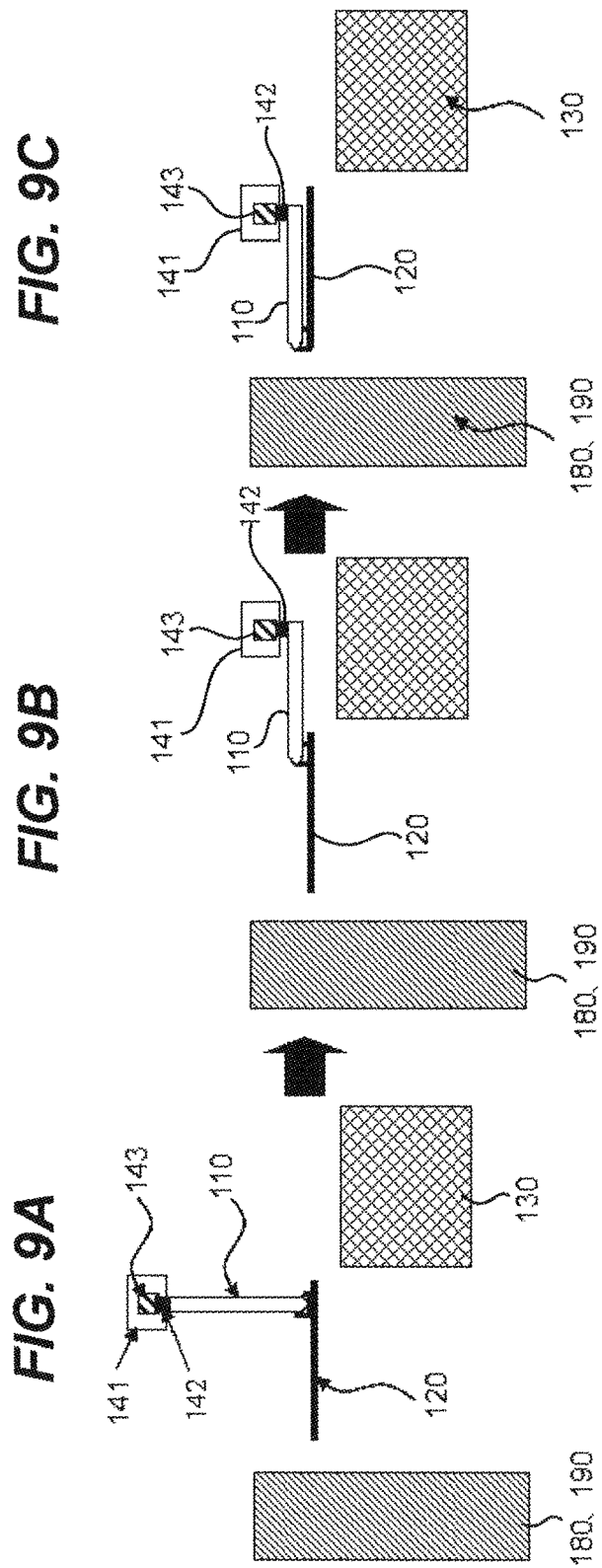

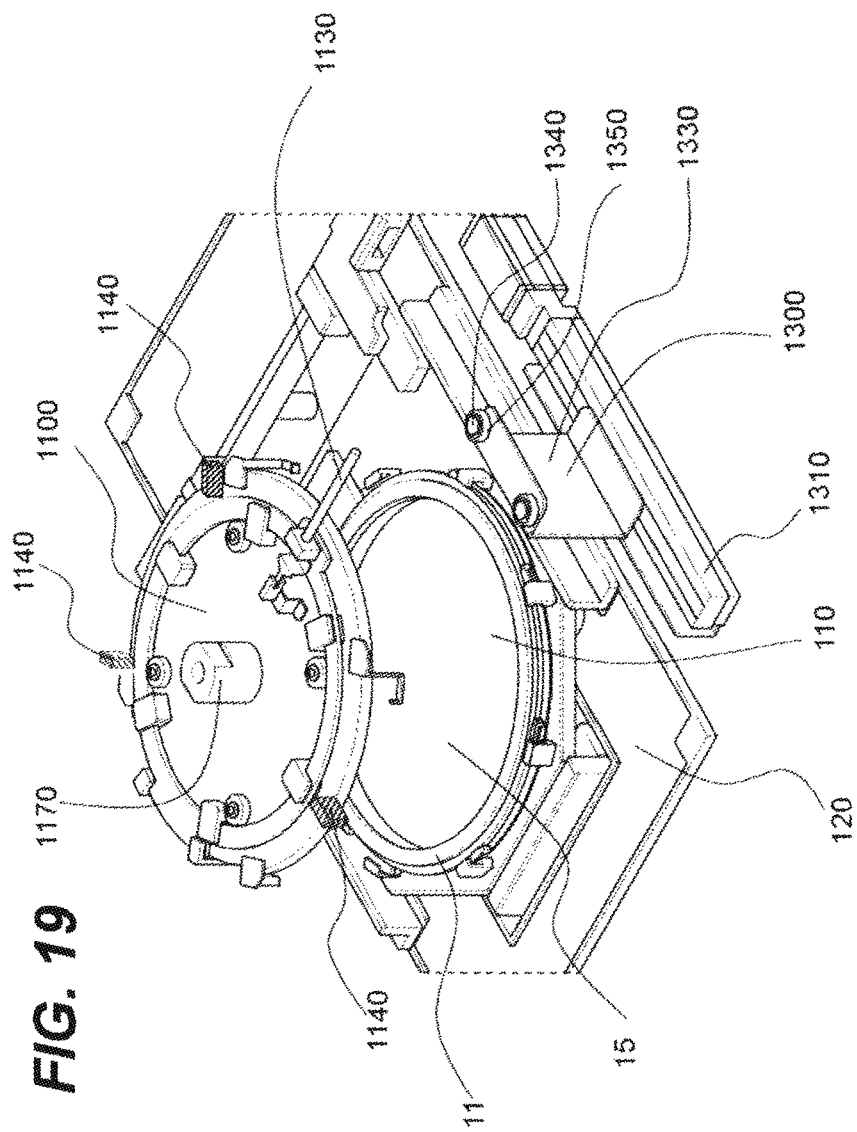

PLATING APPARATUS AND PLATING METHOD

BACKGROUND OF THE INVENTION

Field of the Invention:

The present invention relates to an apparatus for and a method of plating a surface of a workpiece (substrate) such as a semiconductor wafer, and more particularly to a plating apparatus and a plating method which are suitable for forming plated films in fine interconnect trenches, holes, or resist openings defined in a surface of a substrate, or forming bumps (protrusive electrodes) to be electrically connected to electrodes of a package or the like on a surface of a substrate. For three-dimensionally packaging of semiconductor chips or the like, it is necessary to form a number of through via plugs in substrates which are referred to as interposers or spacers. The plating apparatus and the plating method according to the present invention are also used to fill via holes for forming such through via plugs. More specifically, the present invention is concerned with a dip-type plating apparatus and a dip-type plating method for plating a substrate held by a substrate holder by immersing the substrate in a plating solution in a plating tank.

Description of the Related Art:

Apparatus for plating substrates are generally classified into face-down type plating apparatus and dip-type plating apparatus.

A face-down type plating apparatus performs plating of a substrate such as a semiconductor wafer while the substrate is being held horizontally by a head with its surface to be plated facing downwardly. The substrate is normally housed in a carrier receptacle such as an FOUP (Front Opening Unified Pod) or the like while the substrate is being held horizontally with its surface to be plated facing upwardly. Therefore, before the substrate is plated by the face-down type plating apparatus, the substrates needs to be turned upside down within the face-down type plating apparatus.

On the other hand, a dip-type plating apparatus performs plating of a substrate which is held by a substrate holder by bringing the substrate vertically into a plating solution in a plating tank. Therefore, it is necessary to keep the substrate holder horizontal when the substrate is to be held in the substrate holder, and to keep the substrate holder vertical when the substrate is to be immersed in the plating solution. Consequently, the dip-type plating apparatus has a mechanism for turning a substrate from a vertical state into a horizontal state and also for turning a substrate from a horizontal state into a vertical state.

As shown in FIG. 33, for example, a conventional plating apparatus has an arm 304 rotatably mounted on a transporter 300 by a motor 302. After the arm 304 clamps an end of a substrate holder 306, the motor 302 is energized to turn the arm 304 vertically through 90° to turn the substrate holder 306 from a vertical state into a horizontal state. The substrate holder 306 is then placed horizontally on a table 308. As shown in FIG. 34, another conventional plating apparatus has a fixing station 316 including a vertically rotatable table 310 and a rotational shaft 314 which clamps an end of a substrate holder 312 and rotates the substrate holder 312. The rotational shaft 314 is rotated about its own axis to turn the substrate holder 312 from a vertical state into a horizontal state.

As recent years have seen substrates of greater sizes, mechanisms for rotating arms or tables for use with such substrates have become larger in size, and the time required to turn substrate holders from a vertical state into a horizontal state and also from a horizontal state into a vertical state tends to become longer. The larger mechanisms for rotating arms or tables need a greater space required to turn the arms or the tables in plating apparatus. As a result, the plating apparatus themselves are larger in size and more expensive to manufacture.

The conventional plating apparatus also include a substrate holder opening and closing mechanism, i.e., a fixing robot, which is used to set a substrate on a substrate holder. The substrate holder opening and closing mechanism has been suffering the following problems:

A plating apparatus, which includes a substrate holder for holding a substrate vertically and immersing the substrate in a plating solution, is known. In this plating apparatus, the substrate holder holds the substrate by gripping the substrate between a fixed supporting member and a movable supporting member that can be opened and closed about a hinge. The movable supporting member has a rotatable support member which is not detachable. When the support member is rotated to slide an outer circumferential portion thereof into a damper of the fixed supporting member, a seal ring of the movable supporting member seals the outer circumferential edge of the substrate and certain areas of the fixed supporting member, making it possible for electric power feed contacts of the fixed supporting member to contact the outer circumferential edge of the substrate (see Japanese patent No. 3979847, Japanese patent No. 3778282, Japanese patent No. 3940265, and Japanese patent No. 4162440).

According to the above-described plating apparatus, when the support member rotates, it causes wear on itself, and also causes the movable supporting member to rotate, possibly displacing the substrate out of positional alignment and impairing the sealing capability of the seal ring. To avoid such drawbacks, a pressing rod is applied to press the movable supporting member, and the support member is rotated while reducing wear on the support member with the pressing rod. However, for rotating the support member while reducing wear on the support member, the plating apparatus requires a complex mechanism which is vertically reciprocally movable along a vertical axis and which is also rotatable. The complex mechanism makes a substrate holder opening and closing mechanism complex in structure. The complex substrate holder opening and closing mechanism takes up a large space in the plating apparatus, making the plating apparatus large in size and expensive to manufacture.

Another problem with the conventional substrate holder opening and closing mechanism is that if the substrate holder has a different thickness, then the distance that the pressing rod presses the seal ring against the substrate holder tends to vary. Specifically, if the substrate holder is thinner than its normal thickness, then since the seal ring is not sufficiently compressed, the support member is liable to wear more upon rotation. If the substrate holder is thicker than its normal thickness, then the seal ring is excessively compressed and damaged. Accordingly, the substrate holder, which is not properly fabricated to meet its thickness requirement, is responsible for lowering the sealing capability of the seal ring.

The conventional substrate holder opening and closing mechanism generally incorporates a positional displacement detecting measure for detecting when the substrate is displaced out of positional alignment at the time it is mounted in the substrate holder. According to this positional displacement detecting measure, a substrate guide is disposed on the fixed supporting member at a position near the outer circumferential edge of the substrate. A horizontal light sensor, such as a photosensor or laser sensor, measures the amount of light from a light beam that is applied horizontally over the substrate in the substrate holder. If the substrate is placed on the substrate guide, then the substrate is tilted and blocks the light beam. Therefore, the amount of light detected by the horizontal light sensor is made smaller than if the substrate is properly set in the substrate holder clear of the substrate guide. In this manner, positional displacements of the substrate in the substrate holder are detected based on a reduction in the detected amount of light. When the substrate is displaced out of positional alignment in the substrate holder, the substrate guide keeps the substrate thereon and holds the substrate tilted, preventing the substrate from staying in a horizontal plane out of positional alignment.

However, the horizontal light sensor is problematic in that it may erroneously detect the substrate as being displaced out of positional alignment in the substrate holder when there is a water droplet on the substrate, the substrate is warped itself, the substrate holder is warped itself, a table on which the substrate holder is placed is warped itself, or the substrate holder is tilted by dust or dirt particles applied to the table on which the substrate holder is placed. The horizontal light sensor also suffers a problem as to its detection accuracy because the substrate guide has its height limited by the size of the substrate holder and the amount of light that can be detected by the sensor tends to decrease with time on account of smear-induced fogging on the surface of the sensor due to use over time.

In the dip-type plating apparatus, the substrate holder thereof is stored in a stocker therefore before it operates. When the dip-type plating apparatus starts to operate, the substrate holder is taken out of the stocker, and a substrate to be processed is taken out of its storage and held by the substrate holder. The substrate holder, which is holding the substrate, is transported by a substrate holder transporter to the plating tank and other processing tanks associated with the plating process, where the substrate is processed accordingly.

When the substrate holder is found as suffering a trouble such as an electric feeding failure or the like and is to be serviced to remove the trouble, the conventional dip-type plating apparatus has to be shut down and hence its operation availability is lowered. The substrate holder, which is found as suffering an electric feeding failure, is returned to the stocker and inhibited from use until it is serviced. While the dip-type plating apparatus is operating in a plating process, access to the interior of the dip-type plating apparatus is limited for safety reasons. Consequently, when the substrate holder is to be serviced, it is necessary to wait until at least the plating process which has started immediately prior to the trouble. Since the substrate holder, which is inhibited from use, cannot be used in a plating process, the throughput of the dip-type plating apparatus per unit time is reduced.

In the conventional dip-type plating apparatus, the stocker for storing the substrate holder is inseparably incorporated in the apparatus. When the substrate holder placed in the stocker needs to be serviced, the substrate holder is manually removed from the stocker or removed from the stocker by a dedicated hoist. Alternatively, the stocker is carried to a delivery tank or a service area, which is accessible from outside of the dip-type plating apparatus, within the dip-type plating apparatus, and then the substrate holder is manually removed from the stocker or removed from the stocker by a dedicated hoist. It has been tedious and time-consuming to remove the substrate holder from the dip-type plating apparatus and return the substrate holder into the dip-type plating apparatus. The tedious and time-consuming servicing process has been becoming worse because the manual labor required increases and the hoist used becomes larger in size as substrates to be handled are larger in size.

SUMMARY OF THE INVENTION

The present invention has been made in view of the above situation. It is therefore a first object of the present invention to provide a plating apparatus and a plating method which allow a substrate holder to be serviced easily while ensuring easy access to the substrate holder and while a substrate is being processed in the plating apparatus.

A second object of the present invention to provide a plating apparatus, a plating method, and a method of converting the attitude of a substrate holder for use in a plating apparatus, which are capable of converting the attitude of a substrate holder for detachably holding a substrate from a horizontal state into a vertical state or from a vertical state into a horizontal state, without the need for a large-size rotating mechanism.

A third object of the present invention to provide a plating apparatus, which is capable of placing a substrate in a substrate holder with a substrate holder opening and closing mechanism without the need for a large-size, complex mechanism, and of detecting when the substrate is displaced out of positional alignment at the time it is mounted in the substrate holder, while allowing the substrate holder to have a different thickness.

The present invention provides a plating apparatus comprising: a plating section (processing section) for plating a substrate; a substrate holder for holding the substrate; a substrate holder transporter for holding and transporting the substrate holder; a stocker for storing the substrate holder; and a stocker setting section for storing the stocker therein. The stocker includes a moving mechanism for moving the stocker into and out of the stocker setting section.

With this structure, a substrate holder can be taken out of a stocker without stopping the processing of the substrate in the plating apparatus. Consequently, the throughput of the plating apparatus per unit time is not lowered, and the substrate holder can be serviced easily and quickly.

In a preferred aspect of the present invention, the moving mechanism includes a caster for moving and separating the stocker from the plating apparatus.

The stocker setting section may include a door which is selectively openable and closable, and a shutter which is selectively openable and closable for isolating an atmosphere in the stocker setting section and an atmosphere in the plating apparatus from each other when the door is open.

The substrate holder transporter may include a sensor for detecting whether the substrate holder is present in the stocker or not, or the position of the substrate holder in the stocker.

The plating apparatus may include a controller for monitoring and controlling statuses of the substrate holder transporter and the stocker setting section, and indicating section for indicating movement of the stocker to the controller.

The stocker may include a latch handle for locking the stocker in the stocker setting section, and the stocker setting section includes a latch receiver for engaging the latch handle.

In a preferred aspect of the present invention, the stocker setting section includes a door switch for limiting opening of the door and a shutter switch for limiting opening of the shutter, wherein the door switch and the shutter switch work with each other.

The present invention provides a plating method for controlling a plating apparatus to automatically perform the steps of: removing a substrate holder from a stocker; holding a substrate with a substrate holder; transporting the substrate holder which is holding the substrate to a plating section with a substrate holder transporter; plating the substrate in the plating section; and transporting the substrate holder back to the stocker with the substrate holder transporter. The plating method comprises moving the stocker out of the plating apparatus with a moving mechanism of the stocker while the plating apparatus is automatically performing the above steps.

In a preferred aspect of the present invention, the moving mechanism comprises a caster for moving and separating the stocker from the plating apparatus.

In a preferred aspect of the present invention, the plating method includes indicating movement of the stocker out of the plating apparatus to a controller of the plating apparatus before the stocker is moved out of the plating apparatus while the plating apparatus is automatically performing the above steps.

In a preferred aspect of the present invention, the plating method includes closing a shutter to isolating an interior of the plating apparatus from ambient air before the stocker is moved out of the plating apparatus, and opening the shutter to allow the substrate holder transporter to access the stocker after the stocker has been moved into the plating apparatus.

The present invention provides a stocker for storing a substrate holder for use in a plating apparatus, comprising: a substrate holder storage area for storing the substrate holder therein; and a moving mechanism. The stocker is moved and separated from the plating apparatus by the moving mechanism.

The stocker may include a drain pan disposed on a bottom thereof.

The substrate holder storage area may be capable of storing an anode holder therein.

The present invention provides another stocker for storing an anode holder for use in a plating apparatus, comprising: an anode holder storage area for storing the anode holder therein; a drain pan disposed on a bottom thereof; and a moving mechanism. The stocker is moved and separated from the plating apparatus by the moving mechanism.

The present invention provides another plating apparatus comprising: a substrate holder for detachably holding a substrate; a table placing the substrate holder horizontally thereon; a plating section having a plating tank for plating the substrate held by the substrate holder by immersing the substrate in a vertical plane in a plating solution; and a substrate holder transporter for transporting the substrate holder between the table and the plating section. The substrate holder transporter includes a holding portion for holding the substrate holder. The table has a horizontally moving mechanism which is horizontally movable while supporting a lower end of the substrate holder. The substrate holder transporter includes a vertically movable arm for converting an attitude of the substrate holder from a vertical state into a horizontal state or from a horizontal state into a vertical state as the horizontally moving mechanism moves horizontally by vertically moving the holding portion with the lower end of the substrate holder being supported by the horizontally moving mechanism.

With this structure, the substrate holder can be rotated stably without the need for a large-size rotating mechanism, and the plating apparatus can be a space saver and can be manufactured at a reduced cost. In particular, as the substrate holder transporter for transporting the substrate holder to the plating section is used to rotate the substrate holder, no other power mechanism is necessary for rotating the substrate holder. Consequently, the plating apparatus can be manufactured at a greatly reduced cost.

The plating apparatus may includes a sensor for detecting whether the substrate holder transporter is holding the substrate holder or not, or the distance up to the substrate holder held by the substrate holder transporter.

In a preferred aspect of the present invention, the vertically movable arm is caused to stop operating if the sensor detects when the substrate holder transporter is not holding the substrate holder or the distance up to the substrate holder held by the substrate holder transporter deviates from a reference value.

The substrate holder may include a round handlebar, and the holding portion may hold the round handlebar The holding portion may be of a shape for rotatably supporting the round handlebar.

The lower end of the substrate holder to be supported by the horizontally moving mechanism preferably has a semicircular portion that comes into contact with the horizontally moving mechanism.

The horizontally moving mechanism may be normally biased in a direction to lower the holding portion by a weight suspended from the horizontally moving mechanism.

The substrate holder transporter may include a damper for preventing the substrate holder from swinging while the substrate holder is being transported.

The present invention provides a method of converting an attitude of a substrate holder for detachably holding a substrate, the method comprising: holding an end of the substrate holder with a holding portion of a substrate holder transporter; moving the substrate holder held by the holding portion above a table; lowering the holding portion to bring another end of the substrate holder into contact with a horizontally moving mechanism on the table; and further lowering the holding portion to move the horizontally moving mechanism horizontally for thereby converting the attitude of the substrate holder from a vertical state into a horizontal state.

The method may further comprises detecting with a sensor whether the substrate holder transporter is holding the substrate holder or not, or the distance up to the substrate holder held by the substrate holder transporter, and stops operating the holding portion if the sensor detects when the substrate holder transporter is not holding the substrate holder or the distance up to the substrate holder held by the substrate holder transporter deviates from a reference value.

The method may comprises moving the substrate holder transporter horizontally to tilt the substrate holder through a predetermined angle after the other end of the substrate is brought into contact with the horizontally moving mechanism.

The present invention provides another plating method comprising: placing a substrate holder on a table; mounting and holding a substrate with the substrate holder placed on the table; holding an end of the substrate holder with a holding portion of a substrate holder transporter; lifting the substrate holder transporter and moving a horizontally moving mechanism on the table horizontally to convert an attitude of the substrate holder from a horizontal state into a vertical state; moving the substrate holder to a position above a plating tank holding a plating solution with the substrate holder transporter; and lowering the substrate holder with the substrate holder transporter to immerse the substrate in the plating solution in the plating tank.

The present invention provides yet another plating apparatus comprising: a substrate holder for detachably holding a substrate; a table placing the substrate holder horizontally thereon; a plating section having a plating tank for plating the substrate held by the substrate holder by immersing the substrate in a vertical plane in a plating solution; a substrate holder transporter for transporting the substrate holder between the table and the plating section. The substrate holder transporter includes a holding portion for holding the substrate holder and a substrate holder opening and closing mechanism for opening and closing the substrate holder placed on the table. The substrate holder includes a movable supporting member having a rotatable support member, and a fixed supporting member for gripping the substrate in cooperation with the movable supporting member, the movable supporting member being removably secured to the fixed supporting member. The substrate holder opening and closing mechanism includes a head portion for pressing the movable supporting member, the head portion having at least a portion rotatable to secure the movable supporting member to the fixed supporting member and release the movable supporting member from the fixed supporting member, the movable supporting member being removably held by the head portion, a first actuator for vertically moving the head portion, and a second actuator for rotating at least the portion of the head portion.

This can simplify the mechanism for opening and closing the substrate holder to reduce the size of the plating apparatus, so that the cost of the plating apparatus can be lowered.

In a preferred aspect of the present invention, the head portion includes a rotary plate and a presser disk, which has a hanging hook for holding the movable supporting member, for pressing the movable supporting member, the support member includes a lobe, the fixed supporting member includes a damper, the rotary plate is connected to a shaft, and is rotated to rotate the support member when the shaft is pushed by the second actuator, and the lobe is brought into fitting engagement with the damper in response to rotation of the support member to secure the moving supporting member to the fixed supporting member or to move the moving supporting member to a position for being hung by the hanging hook.

The head portion may include a substrate position detecting section for confirming the position of the substrate in the substrate holder.

Thus, positional displacements of the substrate at the time the substrate is placed in the substrate holder can be detected accurately regardless of deformations such as warping of the substrate and the substrate holder and water droplets applied thereto.

The presser disk may have a pressing block for pressing the movable supporting member, the pressing block including a pre-compressed spring disposed therein.

This makes it possible to reduce frictional resistance that is applied to components at the time the substrate holder is opened and closed, and achieve a stable sealing capability for sealing the substrate holder even if the substrate holder has a different thickness.

BRIEF DESCRIPTION OF THE DRAWINGS

FIG. 4A is a schematic view showing the structure of a substrate holder transporter, FIG. 4B is a schematic view showing the manner in which the substrate holder is held by the substrate holder transporter shown in FIG. 4A, and FIG. 4C is a cross-sectional view taken along line Y-Y' of FIG. 4B;

FIGS. 5A through 5F are schematic views showing a sequence of operation of an arm of the substrate holder transporter and a horizontally moving mechanism for horizontally moving a table, for placing the substrate holder horizontally on a table;

FIGS. 6A through 6F are views showing in detail the substrate holder and the horizontally moving mechanism in the sequence operation shown in FIGS. 5A through 5F;

FIGS. 7A through 7D are views showing a sequence of operation of the substrate holder transporter for placing the substrate holder on the horizontally moving mechanism;

FIGS. 8A through 8C are views showing another sequence of operation of the arm of the substrate holder and the horizontally moving mechanism for horizontally moving the table, for placing the substrate holder horizontally on the table;

FIGS. 9A through 9C are views showing yet another sequence of operation of the arm of the substrate holder and the horizontally moving mechanism for horizontally moving the table, for placing the substrate holder horizontally on the table;

FIG. 19 is a perspective view showing the manner in which the substrate holder opening and closing mechanism operates;

DETAILED DESCRIPTION OF THE PREFERRED EMBODIMENTS

Figure 1:
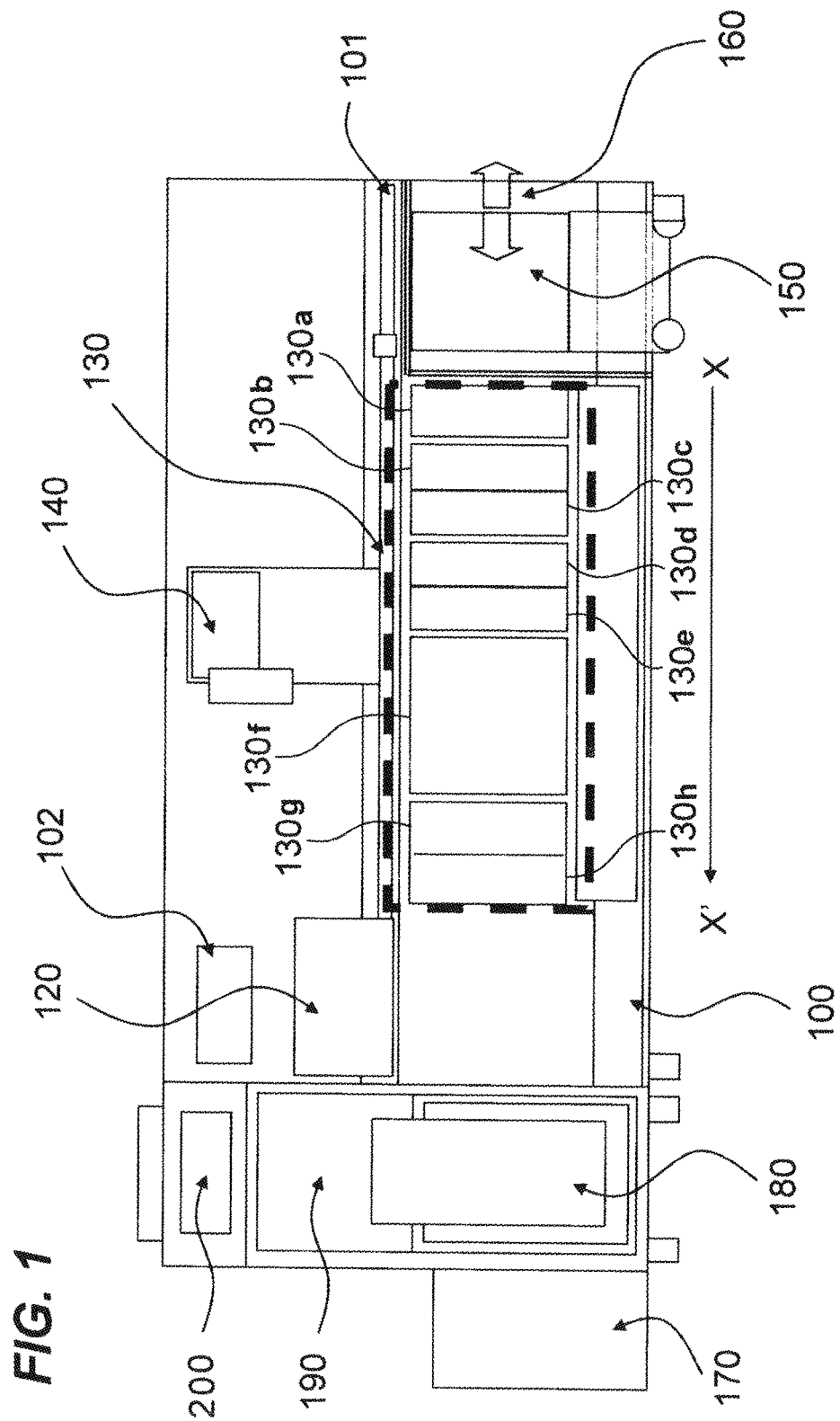
FIG. 1 is a side view schematically showing a plating apparatus according to an embodiment of the present invention.

Preferred embodiments of the present invention will be described below with reference to the accompanying drawings. FIG. 1 is a side view schematically showing a plating apparatus according to an embodiment of the present invention, and FIG. 2 is a plan view of the plating apparatus shown in FIG. 1.

Figure 2:
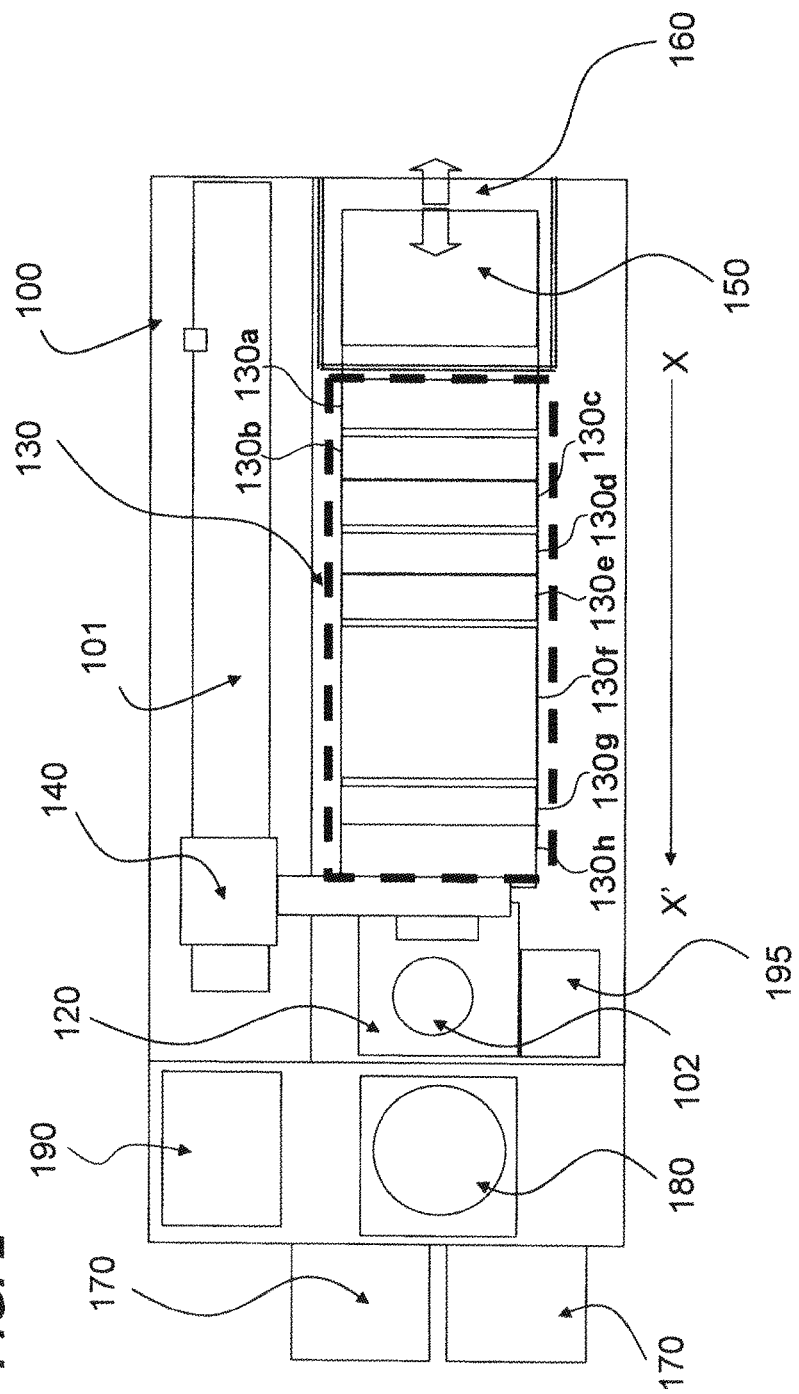
FIG. 2 is a plan view of the plating apparatus shown in FIG. 1.

As shown in FIGS. 1 and 2, the plating apparatus includes an apparatus frame 100, substrate holders 110 (see FIG. 3) for holding substrates 500, a pair of load ports 170 for placing thereon a carrier receptacle such as an FOUP which stores substrates 500, a substrate transport robot 180, a spin rinse dryer (SRD) 190, a table 120, a plating section (processing section) 130, a substrate holder transporter 140, a wagon-type stocker 150, and an aligner 195. The wagon-type stocker 150 is placed in a stocker setting section 160 in the apparatus frame 100. In this embodiment, the wagon-type stocker 150 is used for a stocker.

The substrate transport robot 180 takes out a substrate 500 from a carrier receptacle that is placed on one of the load ports 170 and transports the substrate 500 to the table 120. The substrate transport robot 180 also transports a processed substrate from the table 120 and stores the processed substrate in the carrier receptacle that is placed on one of the load ports 170. The substrate transport robot 180 is rotatable and transports substrates 500 between the load port 170, the table 120, the spin rinse dryer 190, and the aligner 195. The spin rinse dryer 190 rotates a plated substrate 500 while rinsing the plated substrate 500, and finally dries the plated substrate 500 by rotating the plated substrate 500 at a high speed.

The aligner 195 angularly aligns a substrate 500 with a certain position in a circumferential direction thereof. Specifically, the aligner 195 detects the position of a notch or recess defined in the substrate 500, and orients the notch into alignment with an indicated angular position, thereby turning the substrate 500 to the indicated angular position. The aligner 195 also aligns the central position of the substrate 500 with a predetermined position while turning the substrate 500.

The plating apparatus also includes a transport shaft 101 for moving the substrate holder transporter 140 therealong, a substrate holder opening and closing mechanism 102, and a controller 200 including a substrate holder transporter controller.

The substrate holder 110 holds a substrate 500 while sealing its end and reverse surface and exposing its surface to be plated when the substrate 500 is plated. The substrate holder 110 also has electric contacts for electrically contacting the peripheral edge of the surface to be plated of the substrate 500 and for being supplied with electric power from an external power source. The substrate holder 110 is stored in the wagon-type stocker 150 prior to a plating process. When in the plating process, the substrate holder 110 is moved between the table 120 and the plating section (processing section) 130 by the substrate holder transporter 140. After the plating process, the substrate holder 110 is stored back in the wagon-type stocker 150.

The substrate holder 110 can be placed horizontally on the table 120. The substrate transport robot 180 places a substrate 500 in and takes out a substrate 500 from the substrate holder 110 that is placed horizontally on the table 120.

The plating apparatus uses two plating solutions in its plating process. The plating section 130 includes a pre-washing tank 130a, a pre-processing tank 130b, a rinsing tank 130c, a first plating tank 130d, a rinsing tank 130e, a second plating tank 130f, a rinsing tank 130g, and a blowing tank 130h, which are successively arranged in the sequence of the plating process. It is preferable for the processing tanks 130a through 130h to be successively arranged in the sequence of the plating process along the direction from X toward X' for eliminating any extra transport paths. The types of tanks, the number of tanks, and the layout of tanks in the plating apparatus can freely be selected depending on the purpose for which substrates are processed.

In the plating apparatus shown in FIGS. 1 and 2, the substrate 500 held by the substrate holder 110 is processed by processing fluids in the processing tanks 130a through 130h of the plating section (processing section) 130. Particularly, the substrate 500 held by the substrate holder 110 is immersed vertically in the plating solution in the plating tank 130f and plated in the plating solution, while the plating solution is being introduced into the plating tank 130f from below and is overflowing the plating tank 130f. In this embodiment, the plating tank 130f is divided into a plurality of zones, and one substrate 500 held by one substrate holder 110 is immersed vertically and plated in the plating solution in each of the zones. Each zones of the plating tank 130f has an insertion slot for inserting the substrate holder 110 therethrough, a power unit for supplying electric power to the substrate holder 110, an anode, a paddle stirrer, and a shield plate. The anode is mounted on an anode holder and has an exposed surface facing the substrate 500 concentrically therewith.

The substrate holder transporter 140 is movable along the transport shaft 101 between the table 120, the plating section 130, and the wagon-type stocker 150 by a transport mechanism, not shown, such as a linear motor or the like. The substrate holder transporter 140 transports the substrate holder 110 while holding the substrate holder 110 in a vertical attitude.

The wagon-type stocker 150 can store a plurality of substrate holders 110 each extending in a vertical plane. In FIG. 1, the wagon-type stocker 150 is disposed adjacent to a rear surface of the plating apparatus. However, the wagon-type stocker 150 may be disposed in other positions, e.g., between the table 120 and the plating section 130.

An operation sequence of the plating apparatus will briefly be described below by way of example. The operation sequence includes a series of steps (a) through (h) below.

(a) The substrate holder transporter 140 moves to a position above the wagon-type stocker 150, and holds and takes out a substrate holder 110 stored in the wagon-type stocker 150.

(b) Then, the substrate holder transporter 140 moves to a position above the table 120 while holding the substrate holder 110, and places the substrate holder 110 horizontally on the table 120.

(c) A substrate 500 is set in the substrate holder 110.

(d) The substrate holder transporter 140 holds the substrate holder 110 vertically and moves to the pre-washing tank 130a of the plating section 130. Thereafter, the substrate holder transporter 140 moves successively through the processing tanks 130a through 130h of the plating section 130 in the direction from X to X' while at the same time the substrate 500 held by the substrate holder 110 is processed in the processing tanks 130a through 130h.

(e) After the processing of the substrate 500 in the plating section 130 is completed, the substrate holder transporter 140 moves to the table 120 while holding the substrate holder 110 vertically, and then places the substrate holder 110 horizontally on the table 120.

(f) The substrate 500 is removed from the substrate holder 110.

(g) If substrates 500 are to be processed in succession, then a next unprocessed substrate 500 is set in the substrate holder 110, and repeats the above sequence from step (d) to step (f).

(h) When the entire plating process is completed, the substrate holder transporter 140 vertically holds the substrate holder 110 from which the substrate 500 has been removed, and moves to the wagon-type stocker 150, and stores the substrate holder 110 vertically in the wagon-type stocker 150.

In the above operation sequence, after setting the substrate 500 in the substrate holder 110, the substrate holder transporter 140 moves the substrate holder 110, which is holding the substrate 500, to the pre-washing tank 130a of the plating section 130. However, after setting the substrate 500 in the substrate holder 110, the substrate holder transporter 140 may transport the substrate holder 110 to the wagon-type stocker 150 and may temporarily place the substrate holder 110 on the wagon-type stocker 150.

Figure 3:
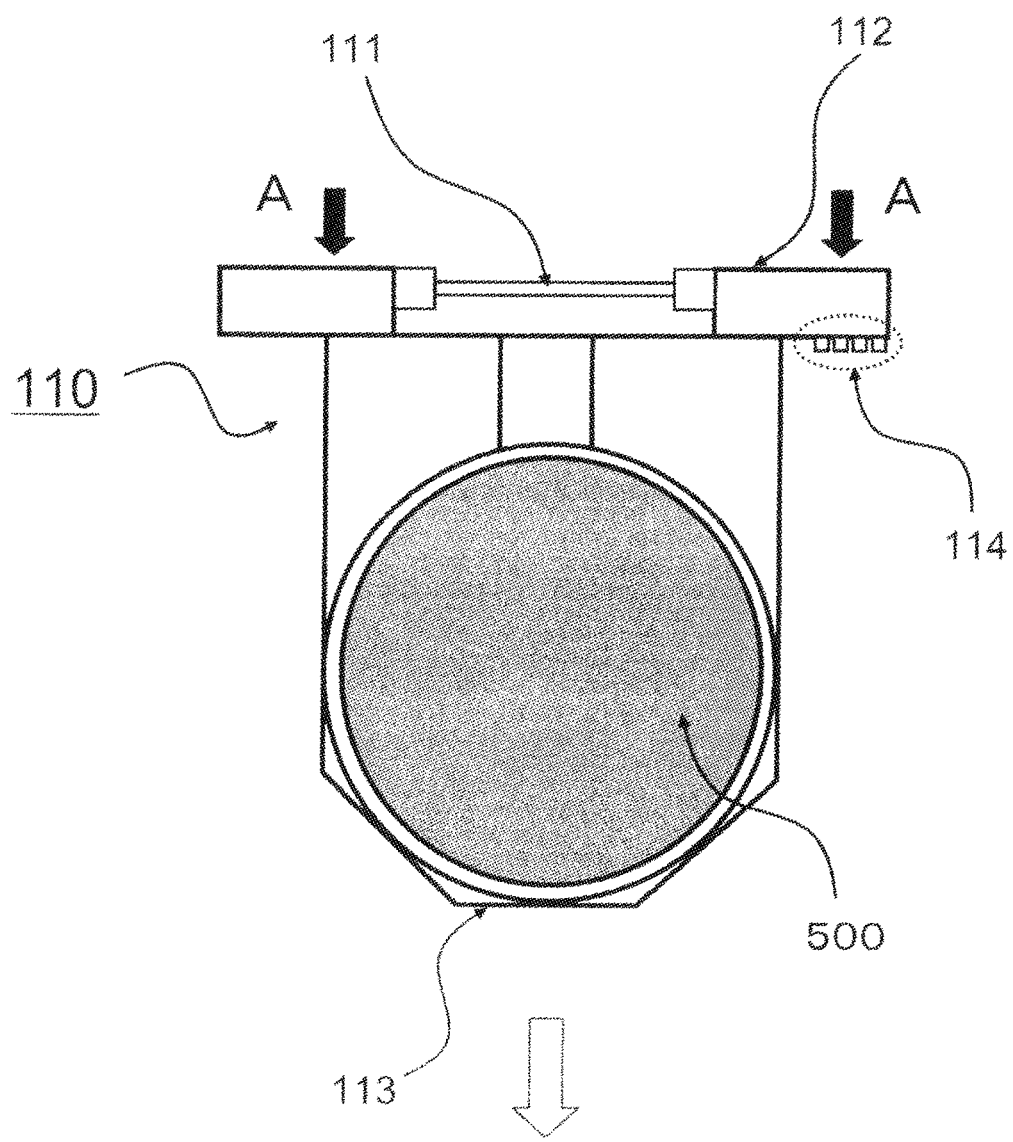
FIG. 3 is a schematic view showing the structure of a substrate holder.

Structural details of the substrate holder 110 will be described below. FIG. 3 is a schematic view showing the structure of the substrate holder 110.

As shown in FIG. 3, the substrate holder 110 has a handlebar 111 on an end thereof. The handlebar 111 is held by the substrate holder transporter 140. The handlebar 111 is in the form of a round bar that is rotatable about its own axis for converting the attitude of the substrate holder 110 from a vertical state into a horizontal state and also from a horizontal state into a vertical state.

The handlebar 111 should desirably be made of stainless steel that is resistant to corrosion to safeguard itself against the plating solution which may be applied thereto. In a case where the handlebar 111 made of stainless steel is still susceptible to corrosion from contact with the plating solution, the surface of the handlebar 111 should desirably be coated with a plated layer of chromium or a layer of titanium carbide (TiC) for increased corrosion resistance. The handlebar 111 may be made of titanium that has high corrosion resistance. In this case, since a level of surface frictional resistance is generally high, it needs to be finished for smooth rotational sliding contact with a lifter 142, to be described later, of the substrate holder transporter 140.

The substrate holder 110 has a pair of hangers 112 on the respective opposite upper ends thereof. Each of the hangers 112 is in the form of a rectangular parallelepiped or a cube. The hangers 112 are placed on respectively hanger receivers and function as a support for hanging the substrate holder 110 at the time the substrate holder 110 is placed in the processing tanks 130a through 130h of the plating section 130. One of the hangers 112 has electric power feed contacts 114. If the plating tanks 130d, 130f are electroplating tanks, then the electric power feed contacts 114 on the hanger 112 are held in contact with electric contacts on the corresponding hanger receiver for supplying an electric current from an external power source to the surface to be plated of the substrate 500. The electric power feed contacts 114 are located out of contact with the plating solution in the plating tank at the time the substrate holder 110 is hung from the hangers 112 placed on the hanger receivers. The hangers 112 are supported on hanger receivers 152, to be described later, of the wagon-type stocker 150 when the substrate holder 110 is stored in the wagon-type stocker 150.

The hangers 112, each in the form of a rectangular parallelepiped or a cube, are designed to prevent the substrate holder 110 from swinging when the substrate holder 110 is moved, against forces that are applied to the substrate holder transporter 140 in the direction indicated by the arrows A shown in FIG. 3. When the substrate holder 110 is in a vertical state with its lower end 113 facing downwardly, the hangers 112 have their upper surfaces lying horizontally.

The lower end 113 of the substrate holder 110 has a semicircular cross-sectional shape (see FIGS. 6A through 6F) for smooth rotational sliding contact with a horizontally moving mechanism 121, to be described later, of the table 120.

FIG. 4A is a schematic view showing the structure of the substrate holder transporter 140. FIG. 4B is a schematic view showing the manner in which the substrate holder 110 is held by the substrate holder transporter 140 shown in FIG. 4A. FIG. 4C is a cross-sectional view taken along line Y-Y' of FIG. 4B.

The substrate holder transporter 140 includes a lifting and lowering mechanism, not shown, incorporated in a vertical support column 145. The lifting and lowering mechanism operates vertically to lift and lower the substrate holder 110. The lifting and lowering mechanism includes a horizontal arm 141 for hanging the substrate holder 110. The arm 141 has a lifter 142 as a holding portion for hanging and holding the substrate holder 110 by supporting the handlebar 111 from below. In order to support the handlebar 111 from below, the lifter or holding portion 142 has a pair of semicircular fingers 142a for engaging the handlebar 111. The semicircular fingers 142a have an inside diameter slightly greater than the outside diameter of the handlebar 111. The lifter 142 has a space between the semicircular fingers 142a, and also includes a sensor 144 as a substrate holder detector for detecting whether the handlebar 111 is present in the space or not and for detecting the distance up to the handlebar 111 in the space. If the sensor or the substrate holder detector 144 detects an abnormal state, or does not detect the handlebar 111, i.e., the substrate holder 110, or detects when the distance up to the handlebar 111 deviates from a reference value, i.e., when the substrate holder 110 is displaced out of position with respect to the arm 141, then the sensor 144 indicates the abnormal state to a lifting and lowering mechanism controller, not shown, which stops lifting and lowering the arm 141. The sensor 144 is also capable of detecting another abnormal state in which the fingers 142a of the lifter 142 do not properly support the handlebar 111 because the substrate holder 110 is positionally displaced when the fingers 142a attempt to support the handlebar 111 from below.

The fingers 142a should preferably incorporate a layer of synthetic resin, such as PTFE or the like, or a layer of aluminum treated with TUFRAM or coated with PEEK in their surfaces held in contact with the handlebar 111 to reduce the coefficient of friction thereof for allowing the handlebar 111 to turn smoothly with respect to the fingers 142a.

The substrate holder transporter 140 includes a pair of dampers 143 for preventing the substrate holder 110 from swinging. When the substrate holder transporter 140 moves horizontally, the dampers 143 apply a downward force to the upper horizontal surfaces of the hangers 112 of the substrate holder 110 to prevent the substrate holder 110 from swinging in the direction along which the substrate holder transporter 140 moves. To prevent the substrate holder 110 from swinging more effectively, the hangers 112 may be designed into a shape for fitting engagement with the dampers 143.

In this embodiment, the dampers 143 are of a downwardly open C shape for applying a downward force to the upper horizontal surfaces of the hangers 112 of the substrate holder 110 and also supporting opposite vertical surfaces of the hangers 112 to prevent the substrate holder 110 from swinging. If the force applied from the dampers 143 vertically to the upper horizontal surfaces of the hangers 112 can be set to a level greater than the force which tends to swing the substrate holder 110, then the dampers 143 do not need to support the opposite vertical surfaces of the hangers 112. Generally, however, since the upper horizontal surfaces of the hangers 112 do not have a large area, the dampers 143 should preferably support the opposite vertical surfaces of the hangers 112.

When the substrate holder 110 is to change from a vertical state to a horizontal state, the dampers 143 are moved upwardly to release the substrate holder 110. The dampers 143 are vertically moved by respective actuators 146 such as air cylinders, electric actuators, or the like which are mounted on the arm 141. The two actuators 146 are used to move the dampers 143 which support the hangers 112 on the opposite ends of the substrate holder 110 in this embodiment. However, a single actuator 146 may be mounted on the arm 141 in alignment with the center of the substrate holder 110, and an attachment, not shown, may be mounted on a movable member of the actuator 146 and connected to the two dampers 146.

The table 120 is used to place thereon the substrate holder 110 horizontally by changing from a vertical state to a horizontal state. The table 120 includes a horizontally moving mechanism 121 (see FIGS. 5A through 5F) for supporting the lower end 113 of the substrate holder 110. The horizontally moving mechanism 121 is slidable in a direction along the transport shaft 101 of the substrate holder transporter 140 along a guide, not shown, such as a linear motion (LM) guide for guiding the lower end 113 of the substrate holder 110 for linear motion, for example.

The horizontally moving mechanism 121 is subject to an external force which is applied by a weight 123 through a wire 122 in this embodiment, tending to return the horizontally moving mechanism 121 to an initial position, i.e., a position where the horizontally moving mechanism 121 is contacted by the lower end 113 of the substrate holder 110 when the substrate holder transporter 140 is lowered toward the table 120, at all times. The weight 123 may be replaced with a helical spring. The horizontally moving mechanism 121 should preferably be of a shape and material suitable for making sliding contact with the lower end 113 of the substrate holder 110.

A sequence of operation for changing the attitude of the substrate holder 110 from a vertical state to a horizontal state and placing the substrate holder 110 horizontally on the table 120 will be described below with reference to FIGS. 5A through 5F, 6A through 6F, and 7A through 7D.

FIGS. 5A through 5F are schematic views showing a sequence of operation of the arm 141 of the lifting and lowering mechanism of the substrate holder transporter 140 and horizontally moving mechanism 121 for horizontally moving the table 120, for placing the substrate holder 110 horizontally on the table 120. FIGS. 6A through 6F are views showing in detail the substrate holder 110 and the horizontally moving mechanism 121 in the sequence operation shown in FIGS. 5A through 5F. FIGS. 7A through 7D are views showing a sequence of operation of the substrate holder transporter 140 for placing the substrate holder 110 on the horizontally moving mechanism 121.

With the lifter 142 of the arm 141 hanging the substrate holder 110 and the dampers 143 clamping the substrate holder 110 against swinging movement, the substrate holder transporter 140 moves to a position above the table 120. The positional relationship between the substrate holder 110 and the horizontally moving mechanism 121 at this time is shown in FIGS. 7A and 7B. The table 120 includes the horizontally moving mechanism 121 which is horizontally movable while supporting the lower end 113 of the substrate holder 110. When the substrate holder transporter 140 moves to the position above the table 120, the arm 141, which is vertically holding the substrate holder 110, starts descending. FIG. 5A shows a state in which the lower end 113 of the substrate holder 110 is lowered to a position slightly higher than the horizontally moving mechanism 121. The positional relationship between the substrate holder 110 and the horizontally moving mechanism 121 at this time is shown in FIGS. 6A and 7B.

Then, as shown in FIG. 7C, the dampers 143 release the substrate holder 110. As shown in FIGS. 5B, 6B and 7D, the arm 141 is then lowered until the lower end 113 of the substrate holder 110 touches the horizontally moving mechanism 121.

During the downward movement of the substrate holder 110 as shown in FIGS. 5A and 5B, the arm 141 should preferably be lowered at a high speed while the dampers 143 are holding the substrate holder 110 against swinging movement until the lower end 113 of the substrate holder 110 reaches a position slightly higher than the horizontally moving mechanism 121. Then, it is preferable to release the substrate holder 110 from the dampers 143 and to lower the arm 141 at a low speed until the lower end 113 of the substrate holder 110 touches the horizontally moving mechanism 121. In this manner, the substrate holder 110 is lowered stably within a short period of time.

When the lower end 113 of the substrate holder 110 has just touched the horizontally moving mechanism 121, the substrate holder 110 is at the bottom dead center of its rotating cycle and cannot smoothly be rotated. Therefore, after the lower end 113 of the substrate holder 110 has touched the horizontally moving mechanism 121, as shown in FIG. 5C, the arm 141 is slightly lowered and slightly moved horizontally toward the plating section 130. Thus, as shown in FIG. 6C, the substrate holder 110 is now tilted and starts to rotate smoothly.

After the substrate holder 110 is tilted through a predetermined angle, preferably about 15°, the arm 141 is lowered to cause the lower end 113 of the substrate holder 110 to push the horizontally moving mechanism 121 under the weight of the substrate holder 110, as shown in FIG. 6D. When the lower end 113 of the substrate holder 110 is lowered, the arm 141 may be slightly moved toward the substrate transport robot 180. The descent of the arm 141 causes the substrate holder 110, whose lower end 113 is supported by the horizontally moving mechanism 121, to be rotated and tilted from a vertical state to a horizontal state, as shown in FIGS. 5D and 5E. Specifically, as shown in FIG. 6E, when the arm 141 is lowered from the position shown in FIG. 6D, the substrate holder 110 is tilted into the horizontal state while being supported at a point A.

When the arm 141 is further lowered, the substrate holder 110 lies horizontally, as shown in FIGS. 5F and 6F, and the downward movement of the substrate holder transporter 140 and the horizontal movement of the horizontally moving mechanism 121 are completed. The weight of the horizontal substrate holder 110 is borne by the table 120 in its entirety. The arm 141 is further lowered, then retracted toward the plating section 130, and thereafter lifted.

As described above, the substrate holder 110 can be converted from a vertical attitude into a horizontal attitude without the need for a large-size rotating mechanism which has a large torque for rotating the substrate holder 110. According to the present invention, it is important to optimally design the distance that the substrate holder transporter 140 moves to tilt the substrate holder 110 initially, the speed at which the arm 141 is lowered, the force applied to return the horizontally moving mechanism 121 to its initial position, the sliding resistance between the handlebar 111 and the fingers 142a of the lifter 142, and the shapes of and the sliding resistance between the lower end 113 of the substrate holder 110 and the horizontally moving mechanism 121.

According to the present invention, the attitude of the substrate holder 110 is converted along with the horizontal movement of the horizontally moving mechanism 121. According to another attitude conversion scheme, as shown in FIGS. 8A through 8C, the lower end 113 of the substrate holder 110 may be held in contact with the left end of the table 120 and the arm 141 may be moved arcuately to bring the substrate holder 110 into a horizontal attitude. However, as shown in FIG. 1, since the substrate holder opening and closing mechanism 102, which enables the substrate holder 110 to release the substrate 500 when the substrate transport robot 180 transports the substrate 500 to the substrate holder 110 or receives the substrate 500 from the substrate holder 110, is disposed above the table 120, the substrate holder transporter 140 and the substrate holder opening and closing mechanism 102 tend to interfere with each other.

According to still another attitude conversion scheme, as shown in FIGS. 9A through 9C, the lower end 113 of the substrate holder 110 may be held in contact with the right end of the table 120, the arm 141 may tilt the substrate holder 110 toward the plating section 130 until the substrate holder 110 lies horizontally, and finally the arm 141 moves the substrate holder 110 onto the table 120. However, as shown in FIG. 9B, since the substrate holder transporter 140 projects a large distance from the table 120 toward the plating section 130 and possibly tends to interfere with the processing operation in the plating section 130.

With the process of changing the attitude of the substrate holder 110 according to the present invention, unlike the above other attitude conversion schemes, when the substrate holder transporter 140 converts the attitude of the substrate holder 110, the substrate holder transporter 140 does not interfere with the substrate holder opening and closing mechanism 102 and the processing operation in the plating section 130. Consequently, there is no need to take into account the distances between the substrate holder transporter 140, and the substrate holder opening and closing mechanism 102 and the plating section 130. The process of changing the attitude of the substrate holder 110 according to the present invention is highly effective to construct the plating apparatus as a space saver.

The horizontally moving mechanism 121 may include a mechanism for moving horizontally by itself rather than under the weight of the substrate holder 110. However, such a mechanism needs its own power source and has to operate in coordination with the arm 141 for converting the attitude of the substrate holder 110, resulting in a complex control process. Accordingly, it is desirable to make the horizontally moving mechanism 121 slidable and to control a mechanism to move the horizontally moving mechanism 121 horizontally under the external force applied from the weight 123 or helical spring for returning the horizontally moving mechanism 121 to its initial position.

As the substrate holder 110 changes from the vertical state to the horizontal state, in this embodiment, the handlebar 111 and the fingers 142a of the lifter 142, and the lower end 113 of the substrate holder 110 and the horizontally moving mechanism 121 slide against each other. If it is not desirable for them to slide against each other, then the opposite ends of the handlebar 111 may be supported by bearings, and a roller may be mounted on the lower end 113 of the substrate holder 110. However, since the substrate holder 110 is immersed in the plating solution, the bearings and the roller are disposed in the plating solution or near the surface of the plating solution. It may not be desirable for the bearings and the roller to be affected by the plating solution. Therefore, to avoid the sliding movement of the parts, rollers may be mounted on the fingers 142a of the lifter 142 or the horizontally moving mechanism 121 to make the handlebar 111 or the lower end 113 of the substrate holder 110 rotatable.

After the processed substrate 500 is removed from the substrate holder 110 placed on the table 120 or a next substrate 500 to be processed is held by the substrate holder 110, the substrate holder 110 changes its attitude from the horizontal state to the vertical state. For such attitude conversion, the fingers 142a of the lifter 142 enter below the handlebar 111 and engage the handlebar 111, and the lifter 142 hangs the substrate holder 110 upon ascent of the arm 141. The horizontally moving mechanism 121 does not disengage from the lower end 113 of the substrate holder 110, and returns to its initial position, bringing the substrate holder 110 into the vertical attitude. The arm 141 is further lifted. While the arm 141 is being lifted, the dampers 143 operate, as described above, to prevent the substrate holder 110 from swinging.

In this embodiment, power is only required to horizontally move the horizontally moving mechanism 140 and to lift and lower the arm 141 for convert the attitude of the substrate holder 110 between the vertical attitude and the horizontal attitude. The mechanisms of the substrate holder transporter 140 for producing horizontal and vertical movement are required to move the substrate holder 110 to the processing tanks and immerse the substrate 500 in the processing solutions in the processing tanks. Therefore, no dedicated power is necessary for changing the attitude of the substrate holder 110.

The present invention is applicable to a wide range of apparatus for holding a substrate with a substrate holder, transporting the substrate holder, and plating the substrate. In this embodiment, the principles of the invention are applied to a plating apparatus by way of example. However, the principles of the invention are also applicable to an etching apparatus, an electroless plating apparatus, or the like. The principles of the invention are applicable to not only a processing apparatus of the type which immerses a substrate holder fully in a processing tank, but also a processing apparatus of the type which includes a processing tank having an opening defined in a vertical sidewall thereof and horizontally closed by a substrate held by a substrate holder. In this embodiment, the plating apparatus includes the single substrate holder transporter which is commonly used to change the attitude of the substrate holder and to transport the substrate holder to the processing tanks including the plating tanks. However, the principles of the invention are applicable to a plating apparatus including a plurality of substrate holder transporters, one for changing the attitude of a substrate holder and another for transporting the substrate holder to the plating section 130, for example.

According to the present invention, as described above, since the substrate holder can be rotated stably without the need for a large-size rotating mechanism, the plating apparatus is a space saver and can be manufactured at a reduced costs. In particular, as the substrate holder transporter, which is used to transport a substrate holder to the plating tanks, is used to rotate the substrate holder, there is no need for a separate power mechanism for rotating the substrate holder, and the plating apparatus can be manufactured at a greatly reduced cost.

A sequence of operation of the substrate holder opening and closing mechanism 102 will be described below. The substrate holder opening and closing mechanism 102 serves to install and remove a lid of the substrate holder 110, i.e., a movable supporting member 11, to be described below, in order to mount a substrate 500 in and remove a substrate 500 from the substrate holder 110 which is placed horizontally on the table 120.

Figure 10:
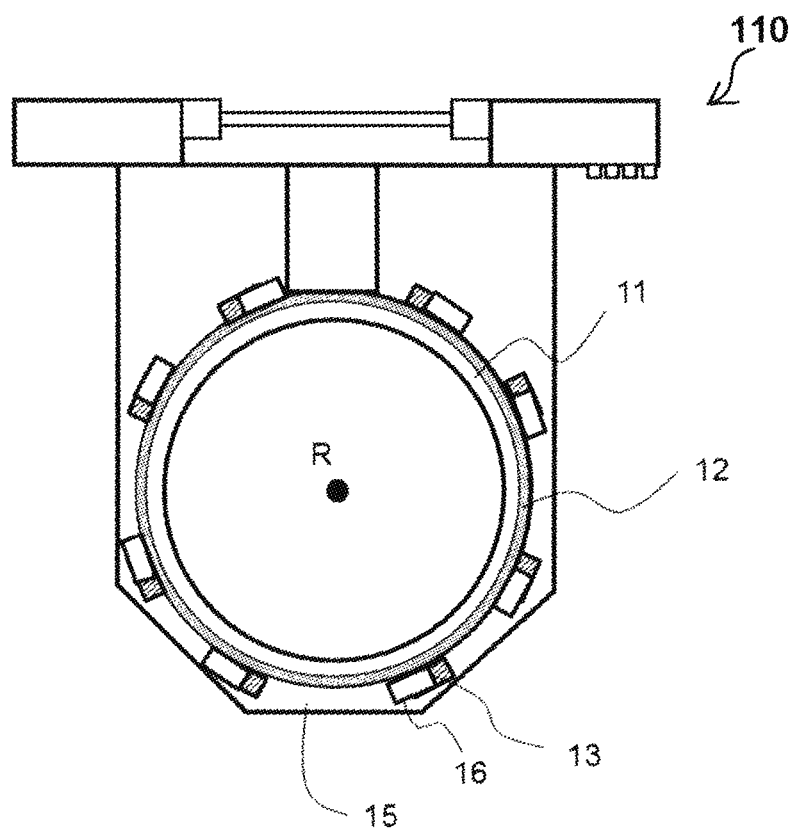
FIG. 10 is a schematic view showing the structure of another substrate holder.
Figure 11A:
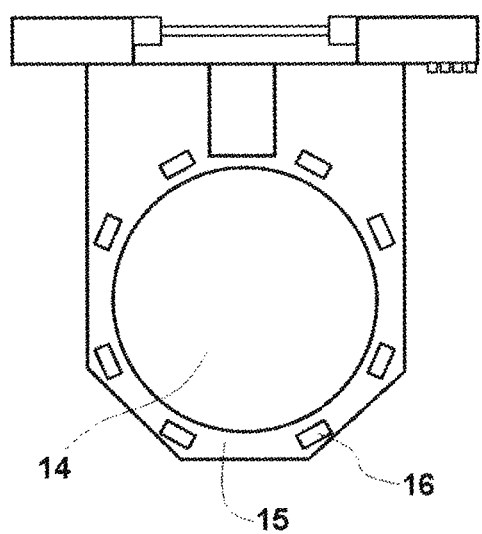
FIG. 11A is a schematic view showing a fixed supporting member of the substrate holder shown in FIG. 10.
Figure 11B:
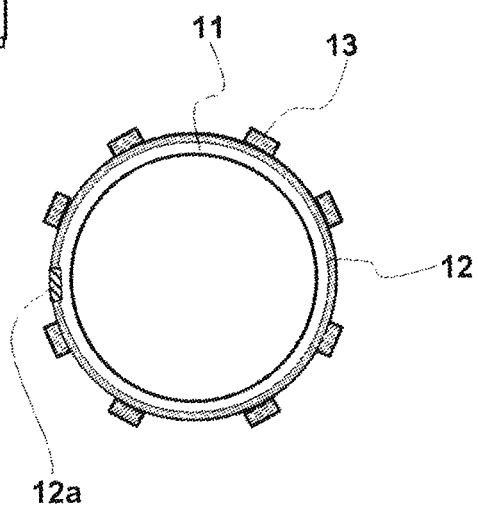
FIG. 11B is a schematic view showing a movable supporting member of the substrate holder shown in FIG. 10.
Figure 12:
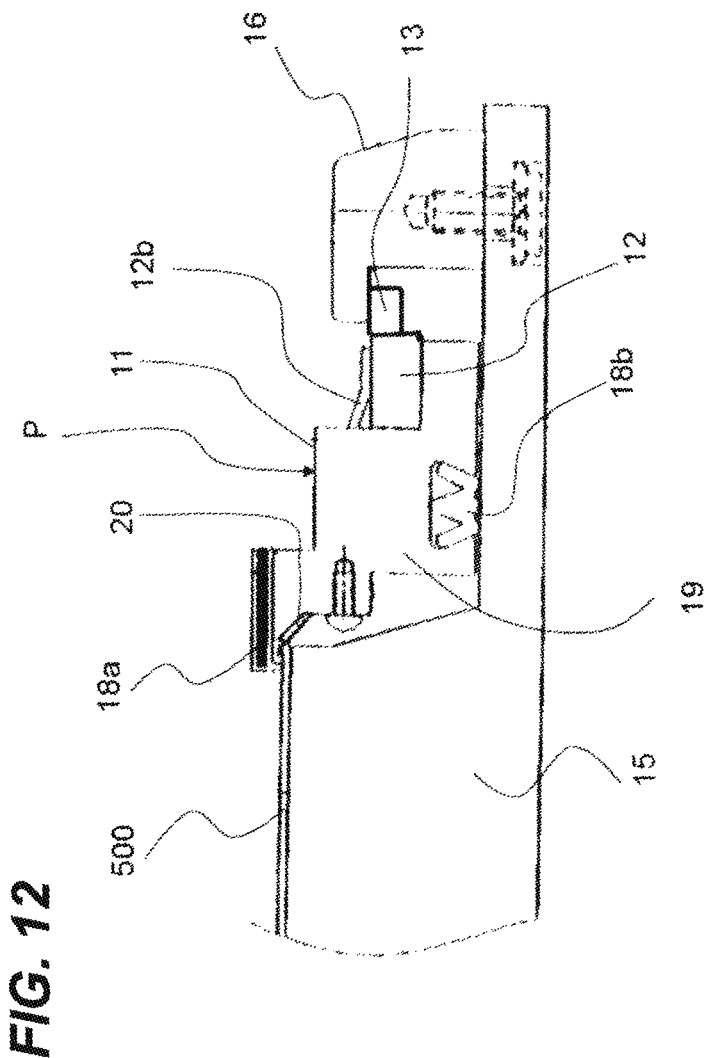
FIG. 12 is an enlarged cross-sectional view of a portion of the fixed supporting member and the movable supporting member of the substrate holder shown in FIG. 10.

FIG. 10 is a plan view showing the structure of a substrate holder 110 in which a movable supporting member 11 is mounted on a fixed supporting member 15 with lobes 13 being held in fitting engagement with respective dampers 16. FIG. 11A is a plan view showing the fixed supporting member 15 of the substrate holder 110. FIG. 11B is a plan view showing the movable supporting member 11 of the substrate holder 110. FIG. 12 is an enlarged cross-sectional view of a portion of the fixed supporting member 15 and the movable supporting member 11 of the substrate holder 110.

As shown in FIGS. 10 through 12, the substrate holder 110 has the movable supporting member 11 as a lid and the fixed supporting member 15 to be placed on the table 120. The movable supporting member 11 and the fixed supporting member 15 grip a substrate 500 therebetween. The movable supporting member 11 is in the form of a substantially circular ring and has a support member 12 and a plurality of lobes 13 integral with and projecting outwardly from the support member 12. The movable supporting member 11 can be fixed to the fixed supporting member 15 and can be removed from the movable supporting member 11. As shown in FIG. 10, the movable supporting member 11 is fixed to an upper surface of the fixed supporting member 15. The fixed supporting member 15 has a plurality of dampers 16 positionally corresponding to the respective lobes 13. The clampers 16 are of an inverted L shape, and have inwardly bent tip ends. When the lobes 13 are fitted in the inwardly bent tip ends of the dampers 16, the dampers 16 secure the movable supporting member 11 to the fixed supporting member 15. The lobes 13 and the dampers 16 should preferably have tapered surfaces for allowing them to fit smoothly with each other.

The support member 12 is rotatably with respect to the movable supporting member 11 and inseparably held by a dislodgment prevention member 12b, and is rotatable, together with the lobes 13, around the center R of the movable supporting member 11 in a substantially horizontal plane. The support member 12 is in the form of a substantially circular ring, for example. The support member 12 has a protrusion 12a disposed on a circumferential surface of the support member 12 and projecting toward a head portion 1100 of a substrate holder opening and closing mechanism, to be described later. The support member 12 is prevented from being dislodged from the movable supporting member 11 by the dislodgment prevention member 12b.

The movable supporting member 11 and the fixed supporting member 15 grip a substrate 500 therebetween, and are secured together when the support member 12 is rotated to bring the lobes 13 into fitting engagement with the dampers 16. For mounting and removing the substrate 500, the support member 12 is rotated to bring the lobes 13 out of fitting engagement with the dampers 16. The substrate 500 is placed on a substrate placing area 14 of the fixed supporting member 15.

The movable supporting member 11 has a first seal ring 18a and a second sealing ring 18b for sealing portions of the substrate 500 which do not need to be plated, e.g., an edge and reverse side thereof, from the plating solution. The first seal ring 18a is held in contact with an outer circumferential edge of the substrate 500, and the second seal ring 18b is held in contact with the surface of the fixed supporting member 15. The substrate holder 110 is used in an electroplating apparatus. Therefore, the substrate holder 110 has electric contacts 20 for contacting an edge area of the substrate 500 sealed by the first seal ring 18a and supplying electric power to the substrate 500. The electric contacts 20 are electrically connected to an external power source while the movable supporting member 11 and the fixed supporting member 15 are gripping the substrate 500 therebetween. The first seal ring 18a and the second seal ring 18b are held by a seal ring holder 19. For the sake of brevity, the first seal ring 18a and the second seal ring 18b may collectively be referred to as a seal ring 18.

For removing the substrate 500 from the substrate holder 110, the movable supporting member 11 is moved away from the fixed supporting member 13. At this time, the first seal ring 18a and the substrate 500 may be secured together, and the substrate 500 may stick to and be lifted with the movable supporting member 11. To prevent the substrate 500 from sticking to the movable supporting member 11, the movable supporting member 11 should preferably have peel springs for biasing the substrate 500 toward the fixed supporting member 15 when the substrate 500 is moved away from the first seal ring 18a and peeling the substrate 500 off the first seal ring 18a. The peel springs are disclosed in Japanese patent No. 4162440.

However, even if the movable supporting member 11 has spring members, depending on the nature and property, such as a material and a thickness, of a resist layer applied to the substrate 500, the substrate 500 may be positionally displaced from the substrate placing area 14 because the seal ring 18a and the substrate 500 are secured to each other when the movable supporting member 11 is removed. In particular, a portion of the edge of the substrate 500 may be secured to the first seal ring 18a, and the substrate 500 may be obliquely lifted and then dropped into a misaligned position on the fixed supporting member 15.

As described later, this problem is solved by preventing the plating apparatus from continuing to operate on a displaced substrate 500 when sensors 1140 of the substrate holder opening and closing mechanism 102 detect a positional misalignment of the substrate 500.

Figure 13:
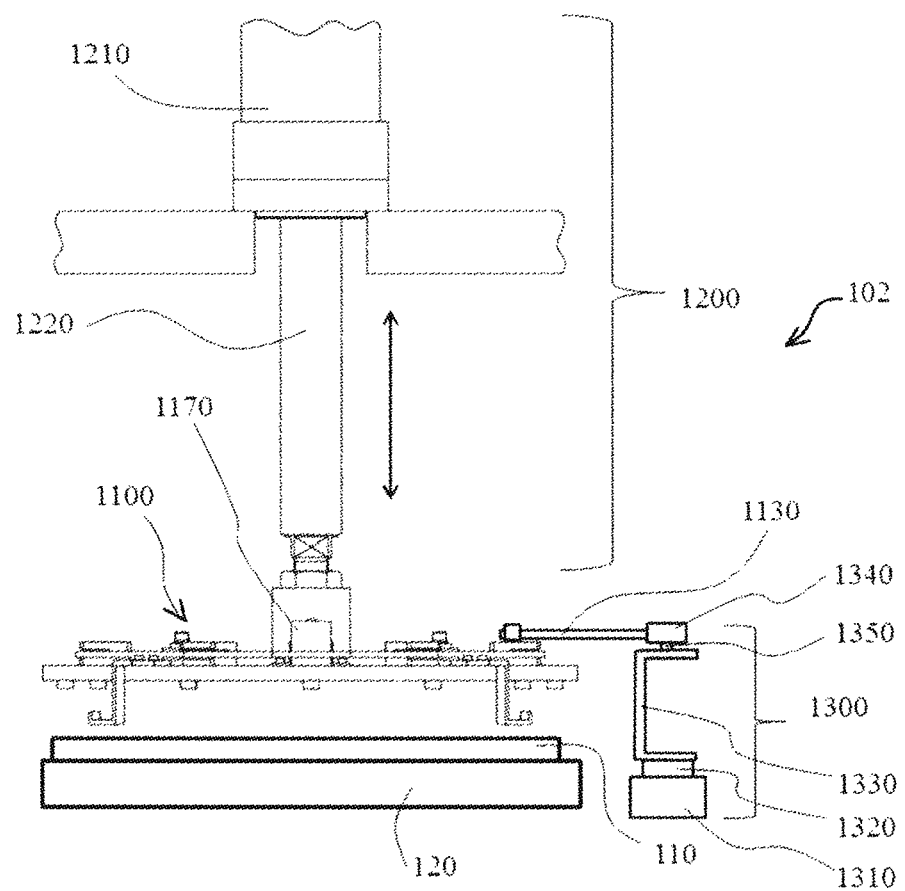
FIG. 13 is a schematic view showing the structure of a substrate holder opening and closing mechanism.

FIG. 13 is a schematic view showing the structure of the substrate holder opening and closing mechanism 102. As shown in FIG. 13, the substrate holder opening and closing mechanism 102 includes a head portion 1100, a first actuator 1200, and a second actuator 1300.

The head portion 1100, which is positioned above the table 120, can hold the movable supporting member 11 of the substrate holder 110 which is placed on the table 120. The head portion 1100 can rotate the support member 12 of the movable supporting member 11 to rotate the lobes 13, for thereby securing the movable supporting member 11 to the fixed supporting member 15 or releasing the movable supporting member 11 from the fixed supporting member 15, and holding the movable supporting member 11.

The first actuator 1200 is connected to the head portion 1100 by a connecting boss 1170 of the head portion 1100. When operated, the first actuator 1200 moves the head portion 1100 vertically. In this embodiment, the first actuator 1200 has an actuator unit 1210 and a shaft 1220 having an end connected to the head portion 1100. The first actuator 1200 moves the head portion 1100 vertically as the shaft 1220 is extended and contracted.

The second actuator 1300 has an actuator unit 1310 which is uniaxially movable and a shaft hook 1330 fixed to a movable plate 1320 of the actuator unit 1310. Two rollers 1340 are rotatably mounted on the shaft hook 1330 at positions spaced therebetween by roller shafts 1350 for allowing a shaft 1130, to be described below, to slide when it is pushed. When the second actuator 1300 is operated, the shaft hook 1330 is reciprocally moved horizontally to push the shaft 1130, which extends from the head portion 1100, to rotate a rotary plate 1150 of the head portion 1100. The second actuator 1300 may comprise a ball screw.

Figure 14A:
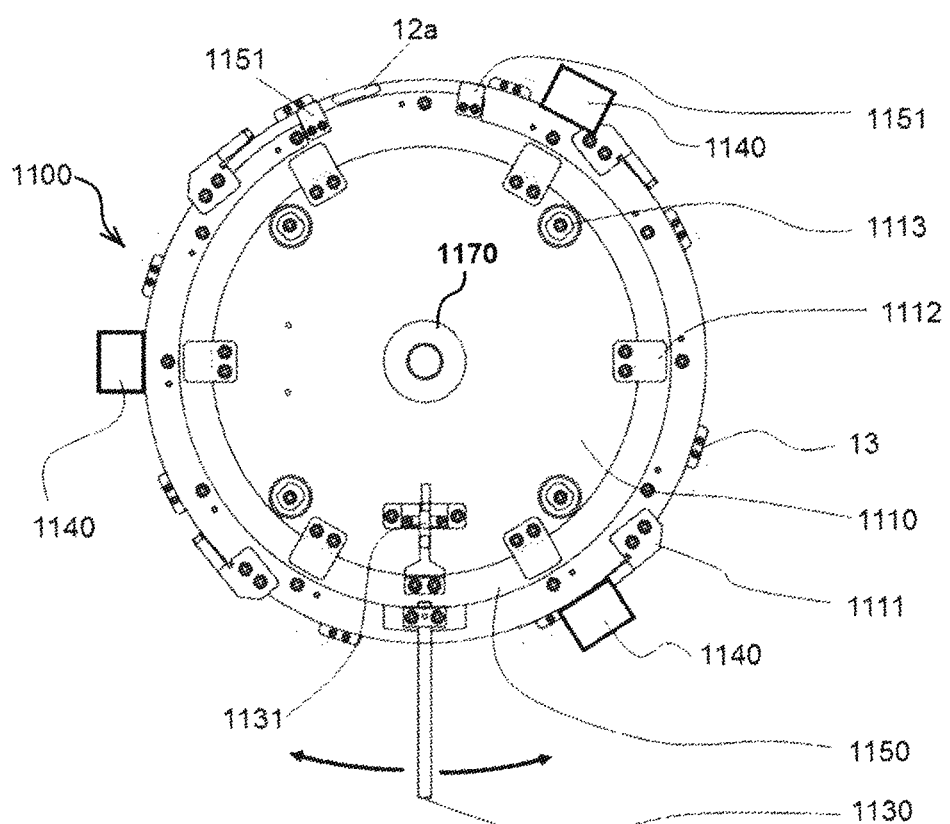
FIG. 14A is a plan view showing the structure of a head portion of the substrate holder opening and closing mechanism.
Figure 14B:
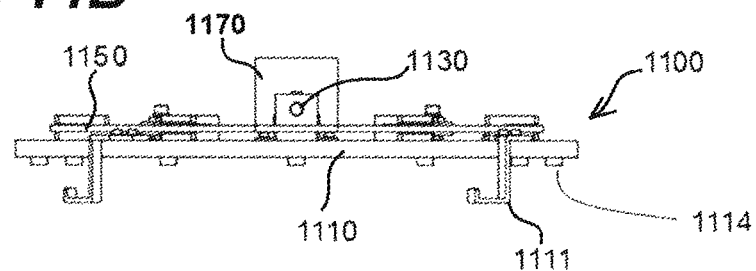
FIG. 14B is a front view of the head portion shown in FIG. 14A.

FIGS. 14A and 14B show structural details of the head portion 1100. As shown in FIGS. 14A and 14B, the head portion 1100 includes a presser disk 1110 and a rotary plate 1150 mounted on the presser disk 1110. The presser disk 1110 includes hanging hooks 1111, rotary plate guides 1112, guide rollers 1113, and pressing blocks 1114. Sensors 1140 are firmly supported on the presser disk 1110 at spaced intervals along the outer circumferential edge thereof.

The rotary plate 1150 has fastening hooks 1151 and is connected to an end of the shaft 1130. The rotary plate 1150 is in the form of a substantially circular ring gripped by the rotary plate guides 1112 on the presser disk 1110. The rotary plate 1150 is rotatable about its central axis in a substantially horizontal plane in rolling engagement with the guide rollers 1113.

The shaft 1130 comprises a bar, for example. When the second actuator 1300 operates to move the shaft hook 1330 horizontally, the shaft 1130 is also moved horizontally, rotating the rotary plate 1150. Specifically, the rotation of the rotary plate 1150 can be controlled by controlling the operation of the second actuator 1300. A sensor 1131 is mounted on the presser disk 1110 for detecting the position of the shaft 1130.

When the rotary plate 1150 rotates about its central axis, it rotates the support member 12 and the lobes 13. In this embodiment, two fastening hooks 1151 extend downwardly from the rotary plate 1150 at respective two circumferential positions. When the rotary plate 1150 is rotated by the second actuator 1300, one of the fastening hooks 1151 pushes the protrusion 12a of the support member 12, rotating the support member 12.

The pressing blocks 1114 are mounted on the bottom surface of the presser disk 1110. When the first actuator 1120 lowers the head portion 1100, the pressing blocks 1114 are brought into contact with the movable supporting member 11 at points P shown in FIG. 12, for example, pressing the movable supporting member 11 downwardly. When the movable supporting member 11 is thus pressed downwardly, the seal rings 18 are deformed by the distance that the movable supporting member 11 is pressed downwardly. As the movable supporting member 11 is caused to descend, creating a gap between the lobes 13 and the dampers 16. Accordingly, the force applied to rotate the support member 12, i.e., the drive power generated by the second actuator 1300, may be relatively small, minimizing wear on the dampers 16 and the lobes 13.

The distance that the pressing blocks 1114 press the movable supporting member 11 downwardly is determined by the position to which the head portion 1100 is lowered. If the substrate holder 110 has a different thickness, then the distance that the seal rings 18 are deformed or compressed is different. Specifically, if the substrate holder 110 is thinner than its normal thickness, then since the seal rings 18 are not sufficiently compressed, the support member 12 is liable to wear more upon rotation. If the substrate holder 110 is thicker than its normal thickness, then the seal rings 18 are excessively compressed and damaged, and their sealing capability may be adversely affected.

Figure 15:
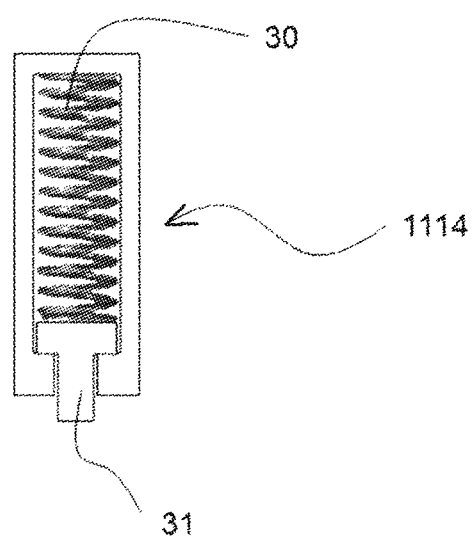
FIG. 15 is a cross-sectional view of a pressing block on the head portion.

The above problem can be solved by using, as shown in FIG. 15, a plunger with a resilient member 30 such as a spring housed therein as each of the pressing blocks 1114. The plunger also houses a pin 31 held against the resilient member 30 and projecting out of the plunger. The resilient member 30 with some resilient force is pre-compressed to a certain extent and housed in the plunger, so that the resilient member 30 normally biases the pin 31 to project from the plunger into contact with the substrate holder 110. The pressing blocks 1114 thus constructed can reduce a difference in the distance to which the seal rings 18 are compressed due to individual dimensional characteristics of the substrate holder 110. Consequently, a thickness difference of the substrate holder 110 is tolerated, stably reducing frictional resistance developed between components at the time the substrate holder 110 is opened and closed and stabilizing the sealing capability of the seal ring 18.

The presser disk 1110 has a plurality of hanging hooks 1111 on its outer edge. When the lobes 13 of the movable supporting member 11 are rotated to positions directly above respective hangers of the hanging hooks 1111, the head portion 1100 is lifted. The lobes 13 of the movable supporting member 11 are now hung by the hanging hooks 1111 to lift the movable supporting member 11 in unison with the head portion 1100. At this time, a clearance is created between the movable supporting member 11 and the fixed supporting member 15, allowing the substrate 500 to be placed on or removed from the fixed supporting member 15.

As described hereinabove, the support member 12 of the movable supporting member 11 is rotated to secure the movable supporting member 11 to the fixed supporting member 15, and the movable supporting member 11 is lifted and lowered by separate actuators, each operating in a single stroke, through the head portion 1100. As a consequence, complex reciprocable and rotatable mechanism, which is required in a conventional plating apparatus, is not required, and the plating apparatus is relatively small in size and simple in structure, and can be manufactured at a low cost. A conventional substrate holder, which includes the movable supporting member 11 and the fixed supporting member 15 joined to each other by a hinge, requires a mechanism for lifting the movable supporting member 11 to be positioned below the table. The substrate holder 110 according to the present invention does not need a dedicated actuator for opening and closing the substrate holder 110.

The sensors 1140 are mounted on the outer circumferential edge of the presser disk 110 as a positional detector for positionally detecting the substrate 500 in the substrate holder 110 that is placed on the table 120. A process of detecting the position of the substrate 500 will be described below with reference to FIGS. 16A and 16B.

Figure 16A:
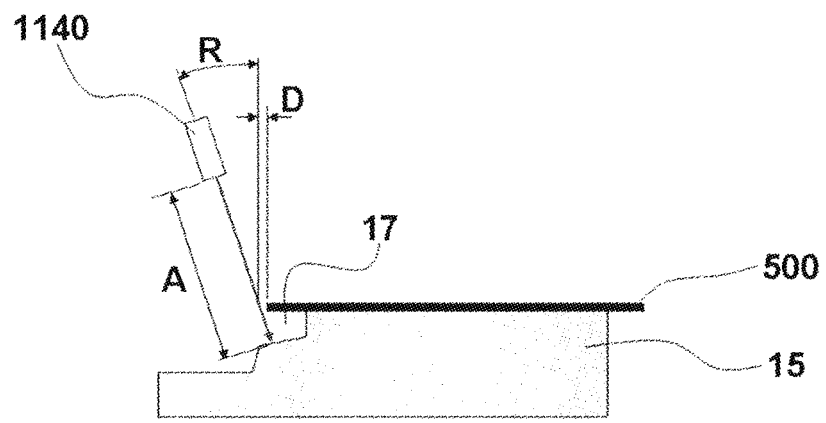
FIGS. 16A and 16B are views illustrative of a process of detecting a positional displacement of a substrate with a sensor.
Figure 16B:
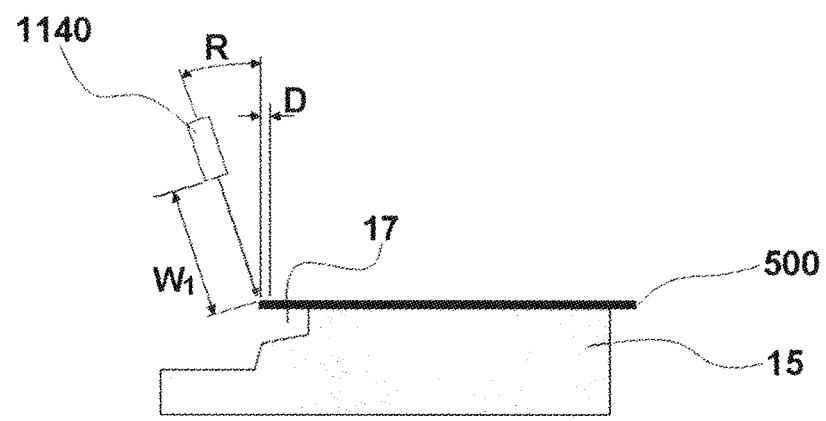
Figure 17:
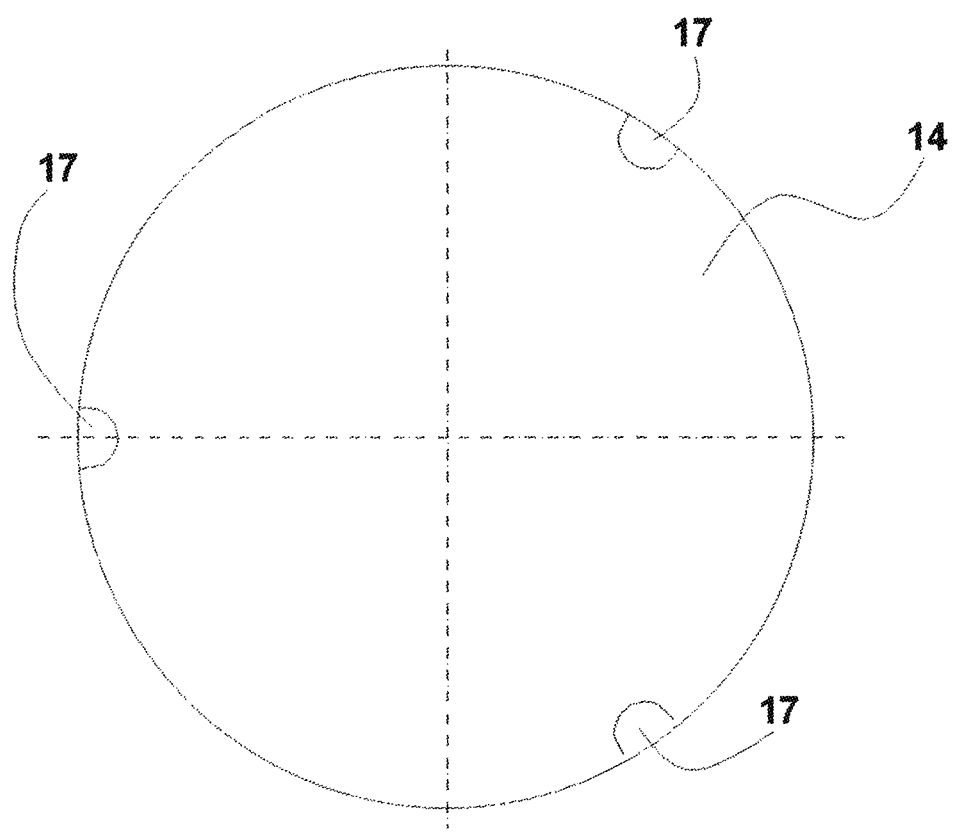
FIG. 17 is a plan view of a substrate holder with recesses defined therein at substrate placing locations.

As shown in FIGS. 16A and 16B, each of the sensors 1140 of the substrate holder opening and closing mechanism 102 is positioned above the substrate holder 110. The sensor 1140 may be a laser sensor, for example, but is not limited thereto. The plural sensors 1140 of the substrate holder opening and closing mechanism 102 are capable of accurately detecting a positional misalignment of the substrate 500. The fixed supporting member 15 of the substrate holder 110 has a recess 17 defined in an outer circumferential edge thereof in alignment with a position where the sensor 1140 applies a laser beam. For example, the substrate holder opening and closing mechanism 102 has three sensors 1140, and, as shown in FIG. 17, the fixed supporting member 15 has three recesses 17 in the outer circumferential edge of the substrate placing area 14. Preferably, each of the recesses 17 has an inclined bottom surface which lies substantially perpendicularly to the axis of the laser beam from the sensor 1140 and which allows the plating solution to flow out of the recess 17, so that a constant distance is maintained between the sensor 1140 and the inclined bottom surface of the recess 17.

The sensor 1140 measures the distance up to an object, and it is determined whether the measured distance falls within a predetermined range or not. For example, if the sensor 1140 positioned at a certain height is spaced from the inclined bottom surface of the recess 17 by a distance A, as shown in FIG. 16A, and the sensor 1140 detects the distance A as a distance up to the inclined bottom surface, then it is judged that the sensor 1140 has measured the correct distance up to the inclined bottom surface, but not the distance up to the substrate 500 on the fixed supporting member 15. Therefore, it is found that the substrate 500 is not positioned between the sensor 1140 and the inclined bottom surface, i.e., the recess 17.

On the other hand, if the sensor 1140 detects a distance $W_1$ smaller than the distance A, as shown in FIG. 16B, then it is judged that the sensor 1140 has measured the distance up to the substrate 500 and the substrate 500 is suffering a positional misalignment.

If the correct distances up to the inclined bottom surfaces of the plural recesses 17 are measured by the corresponding sensors 1140, then it is found that the substrate 500 has no positional misalignment in the directions of any of the recesses 17. Therefore, positional misalignment of the substrate 500 can be detected more accurately.

A threshold value D for determining positional misalignment of the substrate 500 can be set to an appropriate value by adjusting the distance A and a gradient R of the sensor 1140 from the direction normal to the substrate 500. The threshold value D should preferably be in the range from 0.5 mm to 1.5 mm.

When it happens that the substrate 500 is not positioned between the sensors 1140 and the recesses 17, the substrate 500 may not be present on the fixed supporting member 15. For example, the substrate 500 may stick to the movable supporting member 11 and may be lifted together with the movable supporting member 11. To provide against such a situation, as shown in FIGS. 18A and 18B, the sensor 1140 may ascend as the head portion 1100 is lifted and may measure again the distance up to the inclined bottom surface of the recess 17 from a position that is higher than the height at which the sensor 1140 previously measured the distance up to the inclined bottom surface of the recess 17.

Figure 18A:
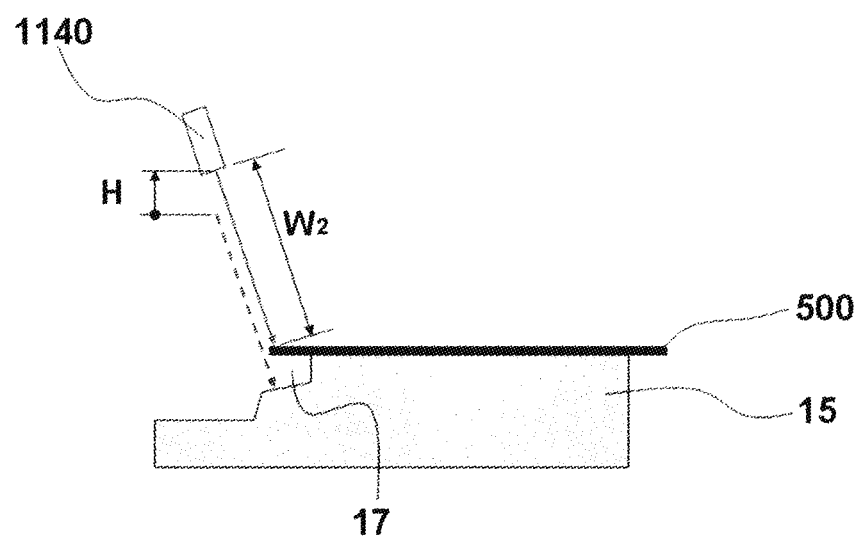
FIGS. 18A and 18B are views illustrative of a process of detecting a positional displacement of a substrate with a sensor.

Specifically, as shown in FIG. 18A, when the sensor 1140 ascends a height H from the height at which the sensor 1140 previously measured the distance up to the inclined bottom surface of the recess 17, the sensor 1140 is spaced from the substrate 500 by a distance $W_2$. If the sensor 1140 measures the distance $W_2$ up to the substrate 500, then it is judged that the sensor 1140 has measured the correct distance up to the substrate 500 and it is found that the substrate 500 is positioned on the fixed supporting member 15.

Figure 18B:
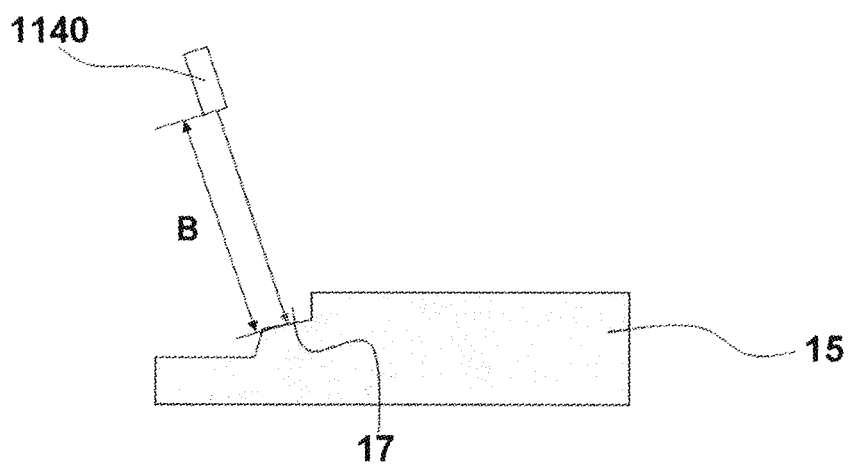

As shown in FIG. 18B, on the other hand, if the sensor 1140 measures a distance B which is smaller than the distance $W_2$, then it is judged that the sensor 1140 has measured the distance up to the inclined bottom surface of the recess 17 and it is found that the substrate 500 is not present on the fixed supporting member 15.

A sequence of operation of the substrate holder opening and closing mechanism 102 for placing a substrate 500 in the substrate holder 110 and removing a substrate 500 from the substrate holder 110 will be described below with reference to FIGS. 19 through 22.

FIG. 19 is a perspective view showing the substrate holder 110 placed horizontally on the table 120 by the substrate holder transporter 140. In this state, the head portion 1100, which is connected to the first actuator 1200 by the connecting boss 1170, is spaced upwardly from the substrate holder 110. The shaft 1130 extends from the head portion 1100 to a position above the second actuator 1300. The substrate holder 110 is not holding a substrate 500, with the movable supporting member 11 being temporarily secured to the fixed supporting member 15 by the lobes 13 that are slightly held in engagement with the dampers 16.

Then, the head portion 1100 is lowered by the first actuator 1200, thereby bringing the shaft 1130 into a position between the two rollers 1340.

Figure 20:
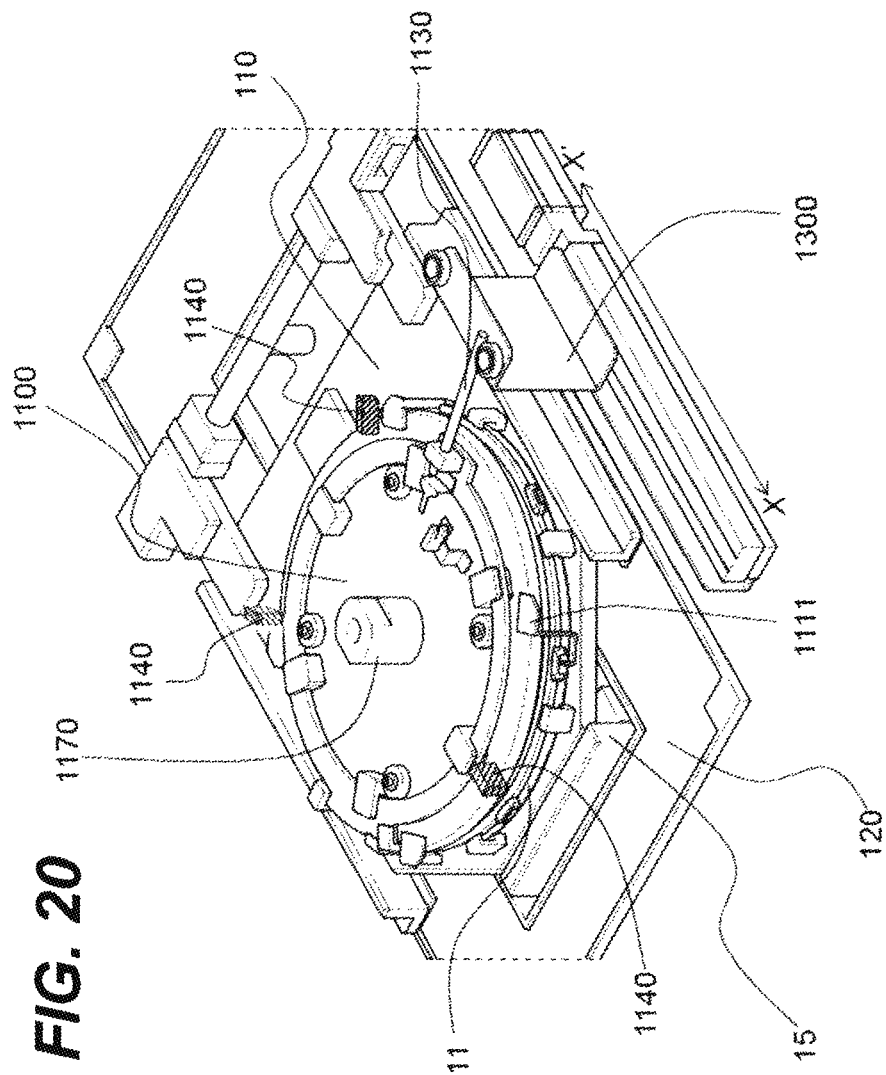
FIG. 20 is a perspective view showing the manner in which the substrate holder opening and closing mechanism operates.

Thereafter, as shown in FIG. 20, the second actuator 1300 is operated to release the movable supporting member 11 from the fixed supporting member 15, i.e., to release the lobes 13 from the dampers 16. In FIG. 20, the shaft hook 1330 is displaced in the direction indicated by the arrow X' by the second actuator 1300, turning the rotary plate 1150 counterclockwise. Thus, one of the fastening hooks 1151 pushes the protrusion 12a of the support member 12, moving the lobes 13 to the hanging hooks 1111, as described above.

The second actuator 1300 moves to its initial position to return the shaft hook 1330 from the position shown in FIG. 20 to its intermediate position in the directions indicated by the arrows X, X'. Then, the first actuator 1200 is operated to lift the head portion 1100, lifting the movable supporting member 11. The substrate transport robot 180 then places a substrate 500 on the substrate placing area 14 of the fixed supporting member 15, as shown in FIG. 21.

Figure 21:
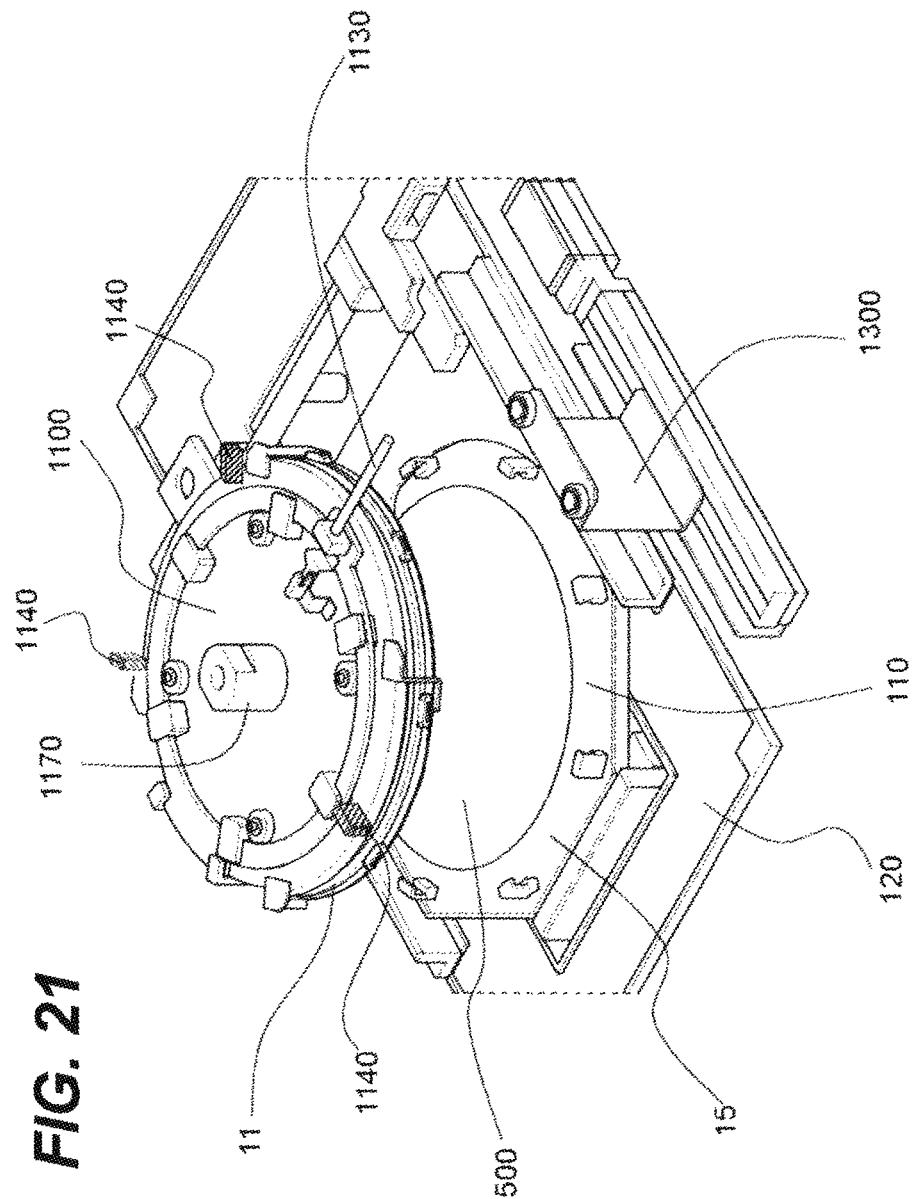
FIG. 21 is a perspective view showing the manner in which the substrate holder opening and closing mechanism operates.

Then, the first actuator 1200 is operated to lower the head portion 1100 from the position shown in FIG. 21. When the pressing blocks 1114 on the lower surface of the presser disk 1110 press the movable supporting member 11, as described above, since the pressing blocks 1114 include the respective resilient members 30 therein, they can reduce a difference in the distance to which the seal rings 18 are compressed due to a different thickness of the substrate holder 110.

Figure 22:
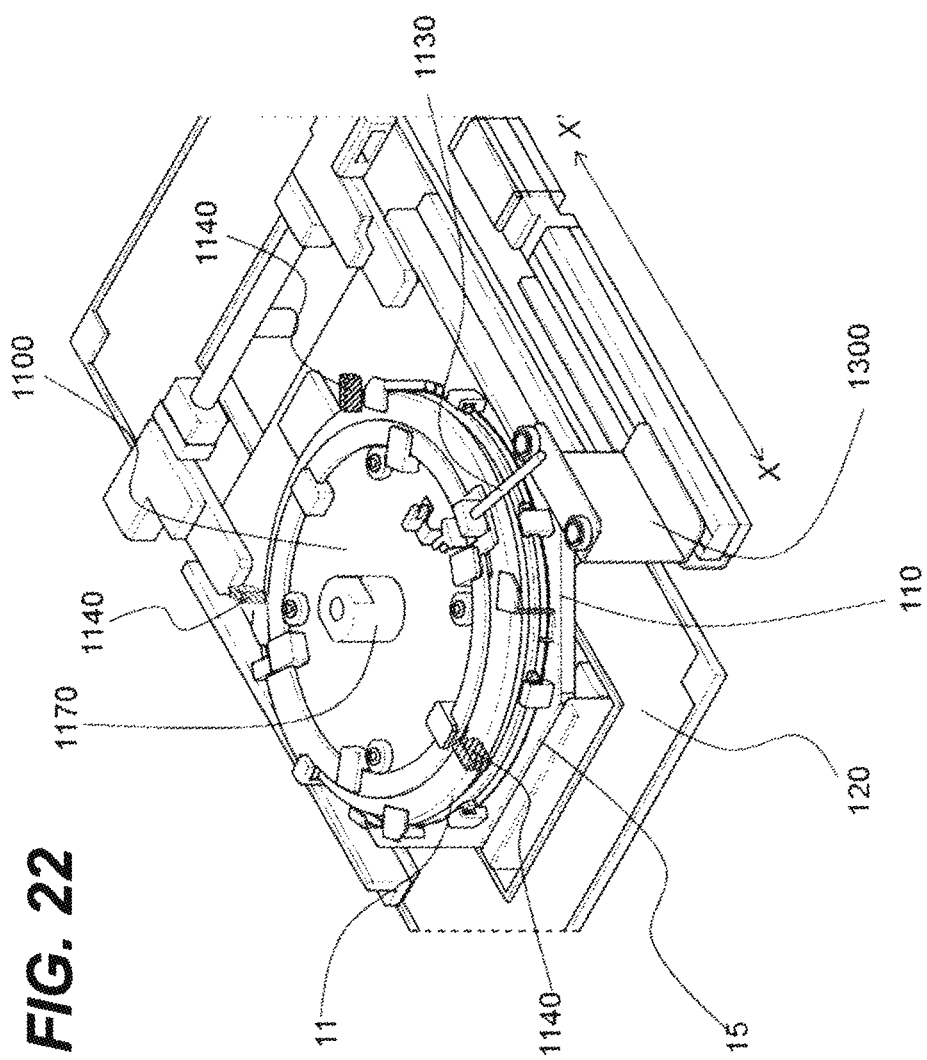
FIG. 22 is a perspective view showing the manner in which the substrate holder opening and closing mechanism operates.

When the first actuator 1200 lowers the head portion 1100 and the second actuator 1300 moves the shaft hook 1330 in the direction indicated by the arrow X from the position shown in FIG. 21, the shaft hook 1330 pushes the shaft 1130 in the direction indicated by the arrow X, turning the rotary plate 1150 clockwise, as shown in FIG. 22. The fastening hooks 1151 push the protrusion 12a of the support member 12, which is also turned clockwise. The lobes 13 are now brought into fitting engagement with the dampers 16. The moving supporting member 11 is now fixed to the fixed supporting member 15 to grip the substrate 500 therebetween.

FIG. 22 shows the lobes 13 and the dampers 16 held in fitting engagement with each other with the substrate 500 gripped between the moving supporting member 11 and the fixed supporting member 15. If the moving supporting member 11 is to be temporarily secured to the fixed supporting member 15 with no substrate 500 gripped therebetween, then the shaft hook 1330 may be stopped at a position slightly preceding the position shown in FIG. 22.

In FIG. 22, after the lobes 13 and the dampers 16 are held in fitting engagement with each other, the second actuator 1300 moves to its initial position to return the shaft hook 1330 to its intermediate position in the directions indicated by the arrows X, X'. The substrate holder 110, which is holding the substrate 500, is then transported by the substrate holder transporter 140 to the plating section 130 where the substrate 500 is duly processed.

After the substrate 500 has been processed, the substrate holder 110, which is holding the processed substrate 500, is placed on the table 120, and the substrate 500 is removed from the substrate holder 110 by the substrate holder opening and closing mechanism 102 and the substrate transport robot 180. A process of separating the moving supporting member 11 from the fixed supporting member 15 in order to remove the substrate 500 from the substrate holder 110 is carried out by the first actuator 1200 and the second actuator 1300 in substantially the same manner as described above.

FIG. 21 also shows the movable supporting member 11 lifted by the head portion 1100 after the substrate holder 110, which is holding the processed substrate 500, is placed on the table 120. If the substrate 500 is secured to and lifted by the first seal ring 18a and then dropped into a misaligned position on the fixed supporting member 15, or if the substrate 500 remains stuck to the movable supporting member 11, then such trouble is detected by the sensors 1140 on the head portion 1100 when they measure the distances up to the fixed supporting member 15 and the substrate 500, as described above.

As described hereinabove, the substrate holder opening and closing mechanism 102 is relatively small in size and low in cost as it is made up of a combination of simple components. Since the substrate holder opening and closing mechanism 102 of this embodiment includes the sensors 1140 on the vertically movable head portion 1100 for detecting positional misalignments of the substrate 500, the substrate holder opening and closing mechanism 102 is capable of detecting positional misalignments of the substrate 500 more accurately than heretofore regardless of whether the substrate 500 and the substrate holder 110 are deformed or not and whether water droplets are applied to the substrate 500 or not. In addition, since the pressing blocks 1114 for pressing the substrate holder 1100 include the respective resilient members 30 therein, they can reduce a difference in the distance to which the seal rings 18 are compressed due to individual dimensional characteristics of the substrate holder 110, thereby stabilizing the sealing capability of the seal ring 18 with respect to the substrate 500.

In this embodiment, the second actuator 1300 is disposed alongside of the table 120. However, since the second actuator 1300 serves to rotate the rotary plate 1150 with respect to the presser disk 1110, the second actuator 1300 may be mounted on the presser disk 1110 for rotating the rotary plate 1150. In this embodiment, the pressing blocks 1114, which include the respective resilient members 30, reduce a difference in the distance to which the seal rings 18 are compressed due to a different thickness of the substrate holder 110. However, the first actuator 1200 for vertically moving the head portion 1100 may comprise a servomotor with a torque monitoring capability, and the servomotor may be controlled to control the descent of the head portion 1100 to make constant the force with which to compress the seal rings 18. In this manner, the distance to which the seal rings 18 are compressed may be made constant regardless of a different thickness of the substrate holder 110.

The wagon-type stocker 150 (see FIGS. 1 and 2) of this embodiment is a stocker for storing substrate holders 110 each extending in a vertical plane. The wagon-type stocker 150 can store at least as many substrate holders 110 therein as the numbers of compartments in the plating tank 130f in the plating section 130. The wagon-type stocker 150 should preferably store an additional group of substrate holders 110 for use as backups for those substrate holders 110 which are found defective due to an electric feeding failure or the like.

The wagon-type stocker 150 is placed in the stocker setting section 160. As shown in FIG. 1, the stocker setting section 160 is disposed adjacent to the rear surface of the plating apparatus with the load ports 170 on a front surface of the plating apparatus. The stocker setting section 160 and hence the wagon-type stocker 150 may be disposed in other positions, e.g., between the table 120 and the plating section 130. However, the table 120, the plating section 130, and the stocker setting section 160 should be successively arranged shown in FIG.1 in this order for higher efficiency because the layout lends itself to a higher throughput per unit time. Specifically, while the plating apparatus is in continuous operation, after a substrate holder 110 has transported a substrate 500, which has been processed in the plating section 130, the substrate holder 110 receives a next substrate 500 to be processed. Therefore, unless the substrate holder 110 suffers a trouble such as an electric feeding failure or the like, it leaves the corresponding compartment in the wagon-type stocker 150 empty and it would cause a transporting time loss for the substrate holder 110 to pass over the empty wagon-type stocker 150. In other words, while the plating apparatus is in continuous operation, the substrate holder 110 is not transported to the right beyond a point indicated by X shown in FIG. 1.

If the wagon-type stocker 150 and hence the stocker setting section 160 are disposed between the table 120 and the plating section 130, then a sidewall of the plating apparatus, which faces the viewer of FIG. 1, needs to have an opening and the wagon-type stocker 150 has to be taken into and out of the stocker setting section 160 through the opening. However, the plating apparatus is generally spaced from adjacent apparatus by a distance of about 1 m, providing a limited space in which the operator brings the wagon-type stocker 150 into and out of the stocker setting section 160 and works on the wagon-type stocker 150. It is difficult to manufacture wagon-type stockers which are movable in such a limited space and which can store a plurality of substrate holders. According to this embodiment, the stocker setting section 160 is disposed adjacent to the rear surface of the plating apparatus because a relatively large space is available behind the rear surface of the plating apparatus for gaining free access to the stocker setting section 160.

Next, structural details of the wagon-type stocker 150 will be described below. When the plating apparatus is shut down, i.e., when no substrates 500 are processed, the wagon-type stocker 150 stores all the substrate holders 110 therein. When the plating apparatus is in operation, i.e., when substrates 500 are processed, necessary substrate holders 110 are taken out of the wagon-type stocker 150 and substrate holders 110 which are not in use or substrate holders 110 which suffer a trouble such as an electric feeding failure or the like are stored in the wagon-type stocker 150.

Figure 23:
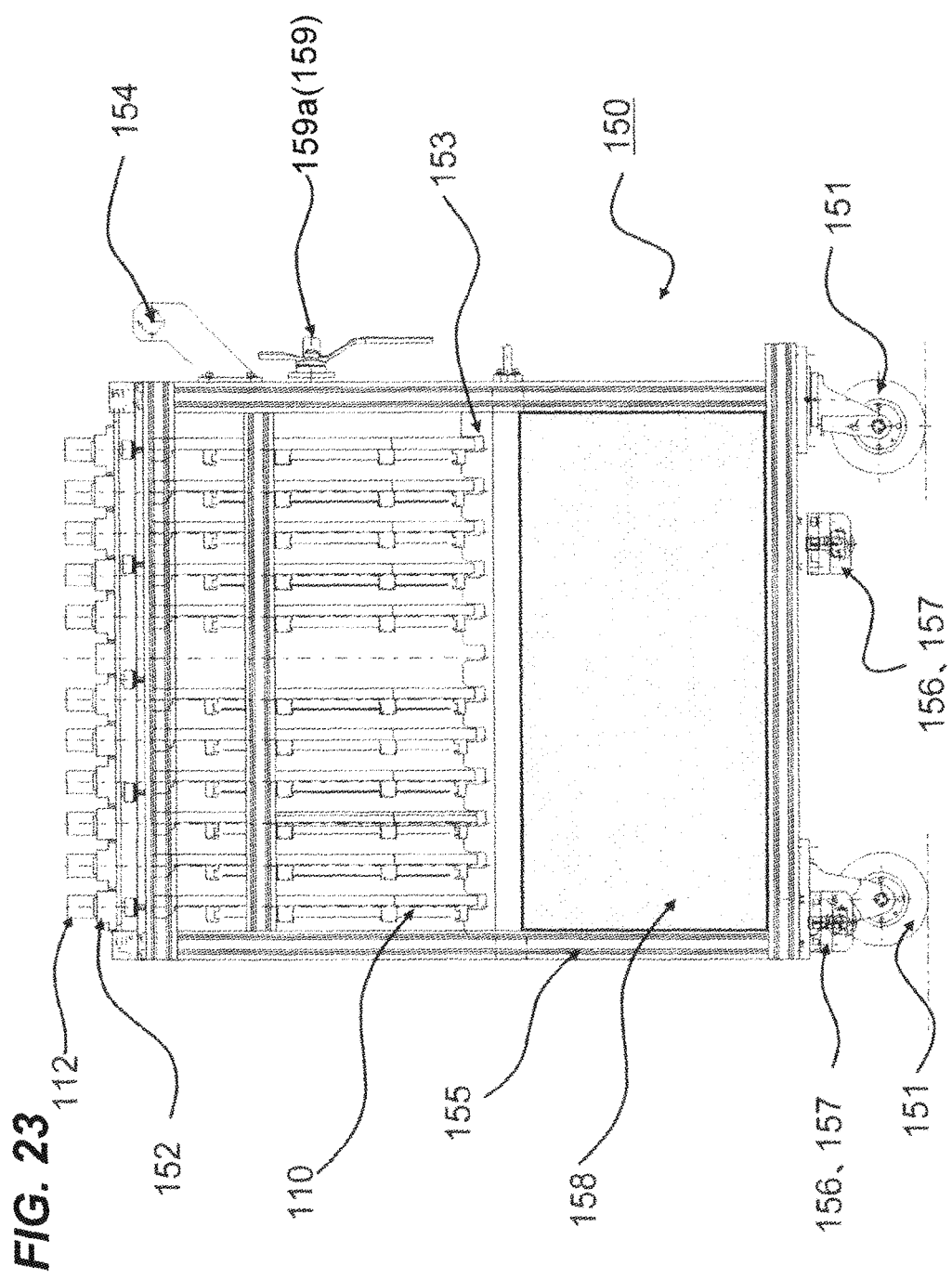
FIG. 23 is a schematic view showing the structure of a wagon-type stocker.

FIG. 23 is a schematic view showing the structure of the wagon-type stocker 150. As shown in FIG. 23, the wagon-type stocker 150 includes a plurality of casters 151 as a mechanism for moving the wagon-type stocker 150, a plurality of hanger receivers 152 for supporting the hangers 112 of substrate holders 110 to hang the substrate holders 110, and a substrate holder swinging prevention member 153 for preventing the substrate holders 110 which are hung by the hanger receivers 152 from swinging. The wagon-type stocker 150 also includes a pair of stocker locks 159 such as latches or the like for locking the wagon-type stocker 150 in the stocker setting section 160, a frame 155, vertical rollers 156, horizontal rollers 157, a drain pan 158, and a handle 154. Details of these components will be described later. The wagon-type stocker 150 has a substrate holder storage area defined in the frame 155 as a space for storing a plurality of substrate holders 110 therein.

Since the wagon-type stocker 150 has the casters 151 as the moving mechanism, the wagon-type stocker 150 can be moved into and out of the stocker setting section 160, i.e., into and out of the plating apparatus. In this embodiment, the casters 151 are used as the moving mechanism. However, the wagon-type stocker 150 may have another moving mechanism instead of the casters 151. For example, rails may be provided for slidingly guiding the wagon-type stocker 150 into and out of the stocker setting section 160. Since the wagon-type stocker 150 can be pulled out of the stocker setting section 160 in the plating apparatus and substrate holders 110 can be taken into and out of the wagon-type stocker 150 outside of the plating apparatus, the burden on the operator is smaller than if substrate holders 110 are taken into and out of the wagon-type stocker 150 manually or by a hoist within the plating apparatus.

Inasmuch as the wagon-type stocker 150 is movable due to the casters 151, the wagon-type stocker 150 can completely be separated from the plating apparatus. After the wagon-type stocker 150 is completely separated from the plating apparatus, the wagon-type stocker 150 can be moved to a servicing area in the plating factory where the substrate holders 110 can be serviced. The substrate holders 110, which are relatively heavy, can be pulled out of the wagon-type stocker 150 by a fixed-hoist in the servicing area. If the wagon-type stocker 150 is inseparable from the plating apparatus, then a movable hoist needs to be pulled to the plating apparatus, and a servicing process for the wagon-type stocker 150 is tedious and time-consuming. However, the separable wagon-type stocker 150 according to this embodiment can be serviced easily.

Figure 24:
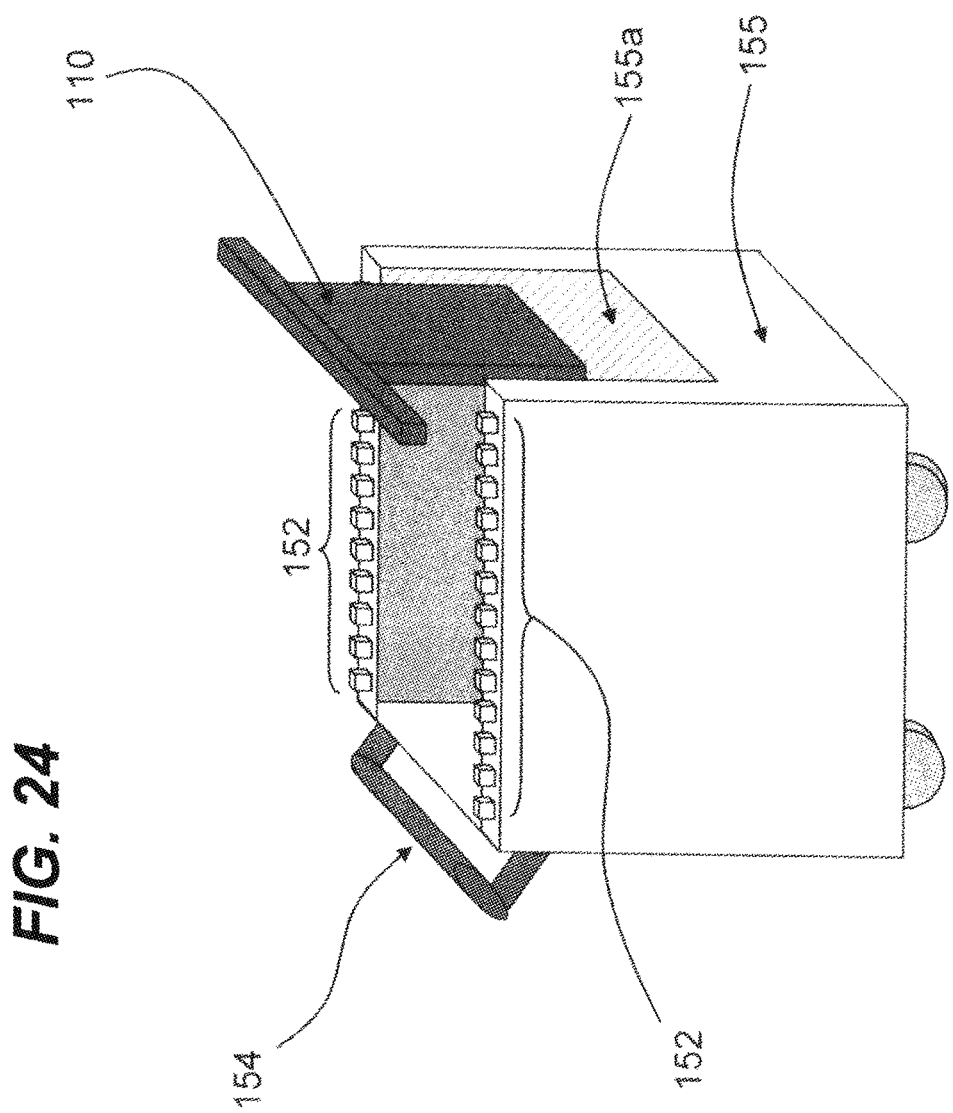
FIG. 24 is a perspective view showing the structure of another wagon-type stocker.

FIG. 24 is a perspective view showing the structure of another wagon-type stocker 150. As shown in FIG. 24, the frame 155 of the wagon-type stocker 150 has a recess 155*a* defined in a sidewall thereof. A substrate holder 110 hung from a hanger receiver 152 can easily be removed from the wagon-type stocker 150 through the recess 155*a*, and a substrate holder 110 can easily be introduced into the wagon-type stocker 150 and hung from a hanger receiver 152 through the recess 155*a*. The recess 155*a* makes it easy to take substrate holders 110 into and out of the wagon-type stocker 150 therethrough without having to lift the substrate holders 110 out of the wagon-type stocker 150.

Figure 25:
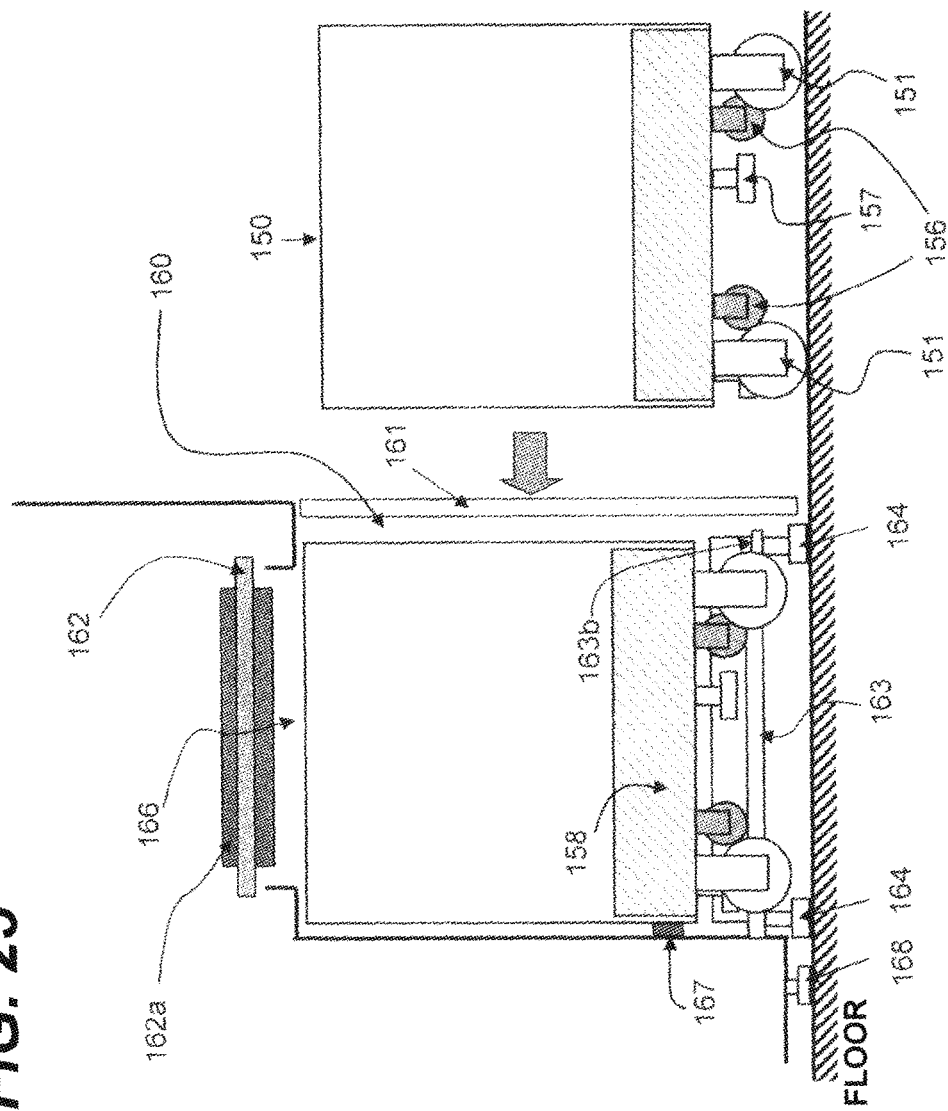
FIG. 25 is a side view schematically showing the wagon-type stocker and a stocker setting section in the plating apparatus.
Figure 26:
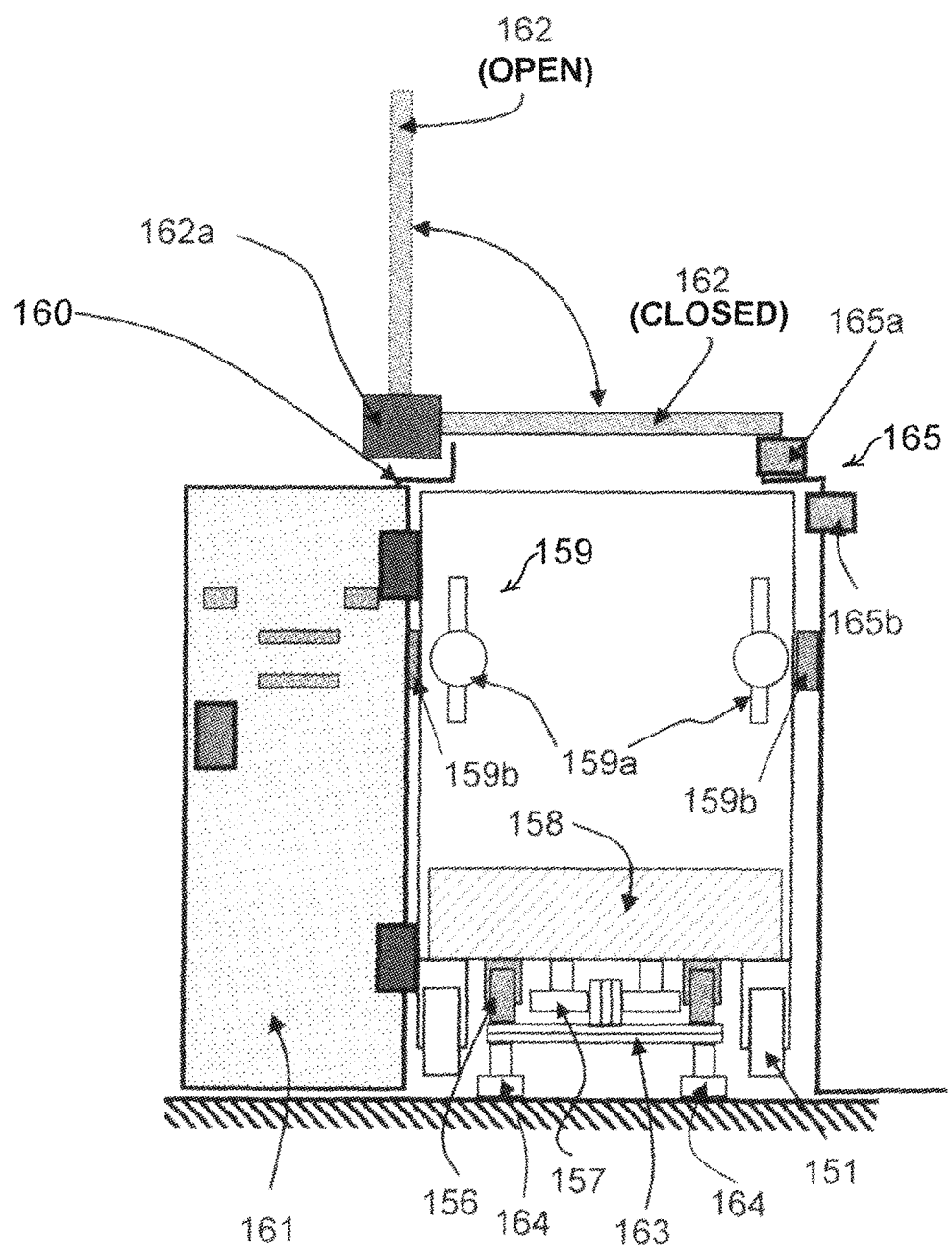
FIG. 26 is a rear view schematically showing the wagon-type stocker and the stocker setting section in the plating apparatus.

FIG. 25 is a schematic side view of the wagon-type stocker 150 and the stocker setting section 160 in the plating apparatus. FIG. 26 is a schematic rear view of the wagon-type stocker 150 and the stocker setting section 160 in the plating apparatus.

The stocker setting section 160 is preferable disposed at a position, which is located adjacent to the rear surface of the plating apparatus in the direction along which the transport shaft 101 of the substrate holder transporter 140 extends, because there is no transporting time loss as the substrate holder 110 does not pass over the empty wagon-type stocker 150 and the tact time is reduced, as described above. The stocker setting section 160 may be disposed between the table 120 and the blowing tank 130*h* shown in FIGS. 1 and 2, for example, rather than adjacent to the rear surface of the plating apparatus. However, when the wagon-type stocker 150 is pulled out of the stocker setting section 160 between the table 120 and the blowing tank 130*h*, the wagon-type stocker 150 is positioned on a side of the plating apparatus. Since the space on the side of the plating apparatus is limited by an adjacent apparatus and fails to give free access to the wagon-type stocker 150, the stocker setting section 160 should desirably be positioned adjacent to the rear surface of the plating apparatus.

As shown in FIGS. 25 and 26, the stocker setting section 160 includes a door 161 disposed in an opening defined in the rear surface of the plating apparatus for the wagon-type stocker 150 to be taken into and out of the stocker setting section 160 therethrough, and a shutter 162 functioning as an opening and closing device for minimizing any gap through which ambient air flows into the plating apparatus when the door 161 is open. In this embodiment, the door 161 includes a lock mechanism worked with the shutter 162. The lock mechanism locks the door 161 in a closed position when the shutter 162 is open.

The lock mechanism of this embodiment includes a shutter switch 165a for locking the shutter 162 and a door switch 165b for locking the door 161. The shutter switch 165a and the door switch 165b are disposed in the stocker setting section 160. Each of the shutter switch 165a and the door switch 165b should preferably be an actuator-combined switch. When an actuator mounted on the shutter 162 or the door 161 is inserted into the shutter switch 165a or the door switch 165b, the shutter switch 165a or the door switch 165b detects that the shutter 162 or the door 161 is closed, and locks the actuator against removal. When an unlock signal is supplied to the shutter switch 165a or the door switch 165b, the shutter switch 165a or the door switch 165b unlocks the actuator. The shutter 162 cannot be opened when the shutter switch 165a is locking the actuator, and the door 162 cannot be opened when the door switch 165b is locking the actuator. The shutter switch 165a and the door switch 165b are worked with each other such that the door switch 165b cannot be unlocked unless the shutter switch 165a is locked, and the shutter switch 165a cannot be unlocked unless the door switch 165b is locked. Accordingly, either one of the shutter switch 165a and the door switch 165b is open, the other is necessarily closed to minimize an influx of ambient air into an area such as the plating section 130 and the substrate holder transporter 140.

Each of the shutter switch 165a and the door switch 165b may comprise a solenoid-operated safety switch. A rear panel of the plating apparatus may be used as an integral door of the wagon-type stocker 150, instead of the door 161 of the stocker setting section 160. The shutter 162 comprises a pivoted shutter which is angularly movable between an open position and a closed position by a shutter rotating mechanism 162a for saving space. The stocker setting section 160 detects by the shutter switch 165a when the shutter 162 is opened and closed.

In this embodiment, each of the stocker locks or latches 159 includes a latch handle 159a for firmly fixing the wagon-type stocker 150 to the stocker setting section 160. When the wagon-type stocker 150 is placed in the stocker setting section 160, the stocker locks or latches 159 keep the wagon-type stocker 150 immovable in the stocker setting section 160. A resilient block 167 made of rubber or the like is mounted on an end of the wagon-type stocker 150, which serves as a leading end when the wagon-type stocker 150 moves into the stocker setting section 160, or a rear surface of the stocker setting section 160 against which the wagon-type stocker 150 abuts upon entry into the stocker setting section 160. The resilient block 167 serves to reduce a shock when the wagon-type stocker 150 and the rear surface of the stocker setting section 160 contact each other. When the wagon-type stocker 150 is to be introduced into the stocker setting section 160, the operator pushes the wagon-type stocker 150 into the stocker setting section 160 until it presses the resilient block 167, and then secures the wagon-type stocker 150 in place in the stocker setting section 160 with the stocker locks or latches 159.

Figure 27:
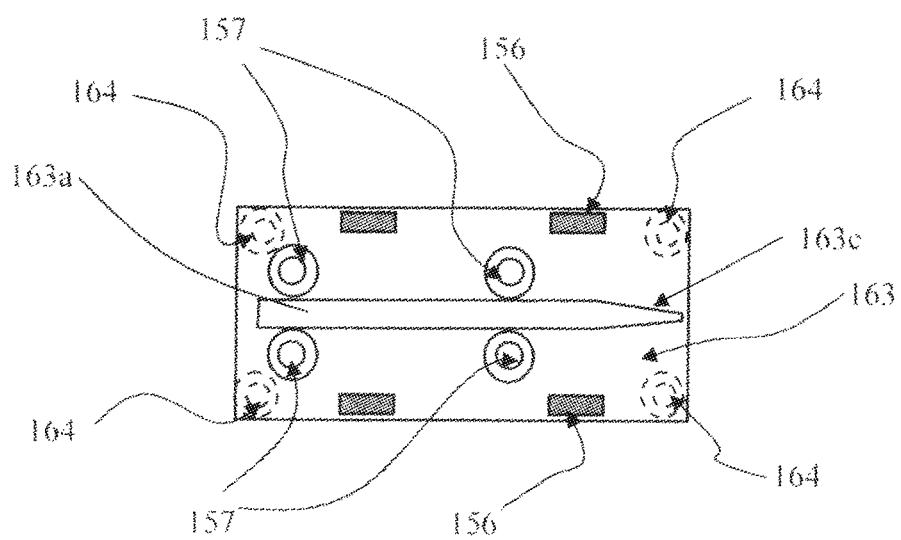
FIG. 27 is a plan view of a guide plate in the stocker setting section and vertical rollers and horizontal rollers on the wagon-type stocker.
Figure 28:
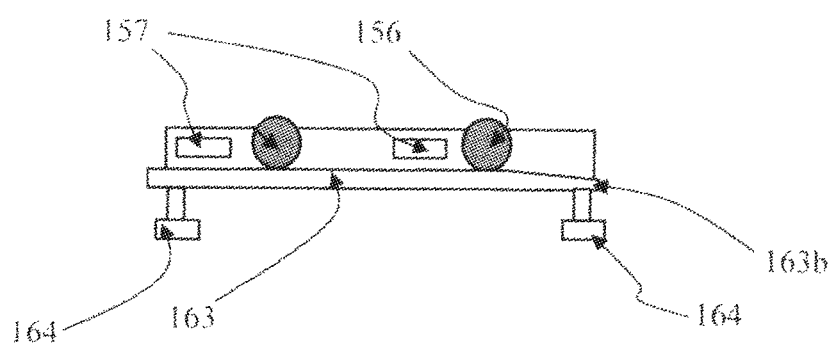
FIG. 28 is a front view of the guide plate in the stocker setting section and the vertical rollers and the horizontal rollers on the wagon-type stocker.

In this embodiment, the stocker setting section 160 has a horizontal guide plate 163 disposed therein for adjusting the position and height of the wagon-type stocker 150 at the time the wagon-type stocker 150 is taken into and out of the stocker setting section 160. FIG. 27 is a plan view of the guide plate 163 disposed in the stocker setting section 160 and the vertical rollers 156 and the horizontal rollers 157 on the wagon-type stocker 150. FIG. 28 is a side view of the guide plate 163 disposed in the stocker setting section 160 and the vertical rollers 156 and the horizontal rollers 157 on the wagon-type stocker 150.

As shown in FIGS. 27 and 28, the wagon-type stocker 150 includes the vertical rollers (first rollers) 156 besides the casters 150, and the stocker setting section 160 includes the guide plate 163. When the wagon-type stocker 150 is pushed into the stocker setting section 160, the vertical rollers 156 ride onto the guide plate 163. At this time, the casters 151 are lifted off the floor.

Individual plating apparatus usually have different heights from the floor. If the stocker setting section 160 has no guide plate and the casters 151 remain in contact with the floor when the wagon-type stocker 150 is pushed into the stocker setting section 160, then the wagon-type stocker 150 may not be properly positioned vertically with respect to different plating apparatus. A wagon-type stocker 150, which has been adjusted vertically to one plating apparatus, may not be properly positioned vertically with respect to another plating apparatus. Such a drawback is avoided by the guide plate 163 that is vertically positioned as a reference to provide common heights for components in different plating apparatus. Since the wagon-type stocker 150 is supported on the guide plate 163 when it is placed in the stocker setting section 160, the wagon-type stocker 150 can be used in common in different plating apparatus. Stated otherwise, a plurality of wagon-type stockers 150 can be used in one plating apparatus.

For smoothly bringing the wagon-type stocker 150 into the stocker setting section 160, in this embodiment, the guide plate 163 has a central vertical guide rail 163a and the horizontal rollers (second rollers) 157 on the wagon-type stocker 150 are held in rolling contact with side surfaces of the guide rail 163a upon movement of the wagon-type stocker 150 into the stocker setting section 160. When the horizontal rollers 157 are held in rolling contact with the side surfaces of the guide rail 163a, the horizontal rollers 157 limit sideways movement of the casters 151, thereby positionally adjusting the casters 151.

In this embodiment, the guide plate 163 has a slope 163b on its upper surface near the front end thereof for allowing the vertical rollers 156 to ride smoothly onto the guide plate 163. The guide rail 163a has a pair of slopes 163c on its opposite side surfaces near the front end thereof for allowing the horizontal rollers 157 to ride smoothly onto the guide rail 163a. The guide rail 163a may have a width, which is progressively greater in a direction away from the slopes 163c, to gradually reduce the clearance between the horizontal rollers 157 and the guide rail 163a. The horizontal rollers 157 are thus moved in smooth rolling contact with the guide rail 163a, adjusting the wagon-type stocker 150 to a more accurate position in the stocker setting section 160.

Instead of the vertical rollers 156 on the wagon-type stocker 150, ball casters may be mounted on the guide plate 163, and when the wagon-type stocker 150 is pushed into the stocker setting section 160, the wagon-type stocker 150 may move on the ball casters on the guide plate 163. The wagon-type stocker 150 may have rollers and the stocker setting section 160 may have a guide for positionally adjusting the wagon-type stocker 150 in the stocker setting section 160.

In this embodiment, support columns 164 are mounted on a lower surface of the guide plate 163 for bearing the weight of the wagon-type stocker 150. The support columns 164 have a height adjustment function. The height of the whole plating apparatus from the floor is adjusted by adjusters 168 (see FIG. 25) on a lower surface of the plating apparatus. In FIG. 25, the guide plate 163 has a left end fixed to the plating apparatus, and is adjusted to lie parallel to the floor by the height adjustment function of the support columns 164.

The stocker setting section 160 may have a stocker detector, not shown, such as an infrared sensor or a camera for determining whether the wagon-type stocker 150 is in the stocker setting section 160 or not and whether the wagon-type stocker 150 is secured in a proper position in the stocker setting section 160 or not. The stocker setting section 160 may also have an indicator such as a lamp or the like for indicating to the operator whether the wagon-type stocker 150 is in the stocker setting section 160 or not.

Unless the stocker detector detects when the wagon-type stocker 150 is secured in a proper position in the stocker setting section 160 and also unless the door switch 165b locks the door 161, an unlocking signal is not sent to the shutter switch 165a which is locking the shutter 162, i.e., the shutter 162 remains closed. This can prevents substrate holders 110 from suffering a transporting trouble caused when the wagon-type stocker 150 is installed in a wrong position in the stocker setting section 160, or an influx of ambient air from being introduced into the plating section 130 and the substrate holder transporter 140.

Figure 29A:
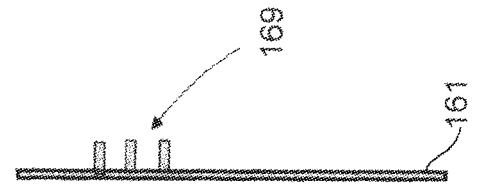
FIG. 29A is a schematic view showing the relationship between latch handles on the wagon-type stocker and latch guides on a door of the stocker setting section.
Figure 29B:
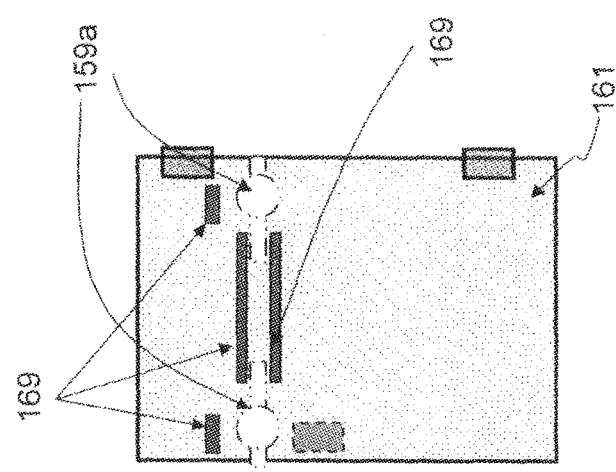
FIG. 29B is a schematic view showing the relationship between the surface of the door on which the latch guides are mounted and the latch handles.
Figure 29C:
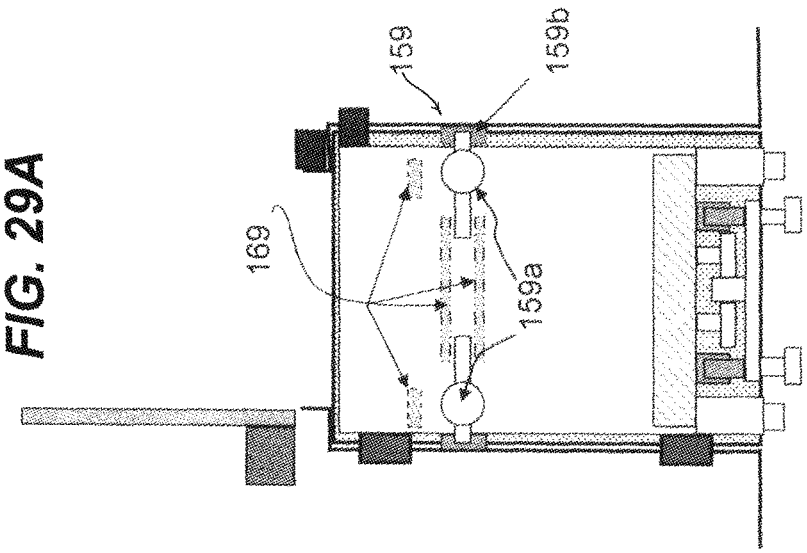
FIG. 29C is a side view of the door with the latch guides mounted thereon.

As shown in FIGS. 29A through 29C, the latch handles 159a are mounted on a sidewall of the wagon-type stocker 150 which faces the door 161. The stocker setting section 160 has latch receivers 159b for receiving the respective latch handles 159a. The latch handles 159a and the latch receivers 159b jointly make up a latch or stocker lock 159 for locking the wagon-type stocker 150 in the stocker setting section 160. The door 161 has latch guides 169 on its surface facing the wagon-type stocker 150 for guiding the respective latch handles 159a.

FIG. 29A is a schematic view showing the relationship between the latch handles 159a on the wagon-type stocker 150 and the latch guides 169 on the door 161 of the stocker setting section 160. FIG. 29B is a side view showing the relationship between the surface of the door 161 on which the latch guides 169 are mounted and the latch handles 159a. FIG. 29C is an end view of the door 161 with the latch guides 169 mounted thereon.

When the latch handles 159a engage the latch receivers 159b, the wagon-type stocker 150 is locked in position in the stocker setting section 160. The latch handles 159a engage the latch receivers 159b while the latch handles 159a are being pushed by the latch receivers 159b under the reactive forces from the compressed resilient block 167.

The latch guides 169 are disposed on an inner surface of the door 161 which faces the wagon-type stocker 150 when the wagon-type stocker 150 is placed in the stocker setting section 160. As shown in FIG. 29C, the latch guides 169 are in the form of ledges projecting from the door 161 and extending substantially horizontally, and are shaped to keep the latch handles 159a therebetween. For installing the wagon-type stocker 150 in the stocker setting section 160 and closing the door 161, it is necessary that the latch handles 159a be oriented substantially horizontally so as to be kept between the latch guides 169.

For orienting the latch handles 159a substantially horizontally, the wagon-type stocker 150 needs to be pushed into a predetermined position in the stocker setting section 160. When the wagon-type stocker 150 is in the predetermined position in the stocker setting section 160, the wagon-type stocker 150 is locked in the stocker setting section 160 by the latch 159 which is made up of the latch handles 159a and the latch receivers 159b. Unless the latch handles 159a are oriented substantially horizontally, the latch handles 159a and the latch receivers 159b interfere with each other, preventing the door 161 from being closed. Therefore, the door 161 cannot be closed unless the wagon-type stocker 150 is pushed into the predetermined position in the stocker setting section 160.

In this manner, the wagon-type stocker 150 can necessarily be installed and locked in the predetermined position in the stocker setting section 160. The wagon-type stocker 150 may have a switch, not shown, for detecting when the latch handles 159a engage the latch receivers 159b in a proper position and an actuator, not shown, for securing the latch handles 159a against undue movement.

As shown in FIGS. 23, 25, and 26, the drain pan 158 is disposed in a lower portion of the wagon-type stocker 150 or on the bottom thereof. As shown in FIG. 25, an opening 166 is defined above the stocker setting section 160 for taking a substrate holder 110 held by the substrate holder transporter 140 therethrough into and out of the stocker setting section 160. The opening 166 is set smaller than the drain pan 158 in the wagon-type stocker 150. Accordingly, when the shutter 162 is open and liquid droplets fall through the opening 166, the liquid droplets are received by the drain pan 158 in the wagon-type stocker 150 and do not drop on and smear the floor.

The stocker setting section 160 may be of a size large enough to place the wagon-type stocker 150 therein. However, it is preferable not to leave a large space between the wagon-type stocker 150 and the stocker setting section 160 when the wagon-type stocker 150 is placed in the stocker setting section 160 so as not to introduce an undue amount of ambient air into the plating section 130 when the shutter 162 is open. Partitions, not shown, may be provide around the wagon-type stocker 150 in order to minimize a change in the area of openings through which ambient air is drawn into the plating apparatus and also to prevent internal air and liquid droplets from being discharged from the plating apparatus, regardless of whether the wagon-type stocker 150 is placed in the stocker setting section 160 or not.

According to the plating apparatus of this embodiment, even while the plating apparatus is in operation, the wagon-type stocker 150 can be pulled out of the plating apparatus, i.e., outside of an outer panel of the plating apparatus, without the need for interrupting the operation of the plating apparatus. Accordingly, the wagon-type stocker 150 can be taken out of the plating apparatus and the substrate holders 110 can be serviced without lowering the operation availability of the plating apparatus. In order to take the wagon-type stocker 150 out of or into the plating apparatus while the plating apparatus is in operation, it is desirable to take into the operation safety of the plating apparatus and also to make efforts to minimize air stream disturbances in the plating apparatus due to access to the wagon-type stocker 150. These requirements for the operation safety of the plating apparatus and the air stream disturbance minimization should be met when accessing the wagon-type stocker 150 while the plating apparatus is not in operation and also should be met more strictly while the plating apparatus is in operation.

While the substrate holder transporter 140 is placing a substrate holder 110 into the wagon-type stocker 150 or removing a substrate holder 110 from the wagon-type stocker 150, the plating apparatus should preferably be controlled to lock the wagon-type stocker 150 against removal from the plating apparatus. Therefore, the plating apparatus includes a substrate holder transporter controller 210 (see FIG. 30) for grasping and controlling operation statuses of the substrate holder transporter 140.

Figure 30:
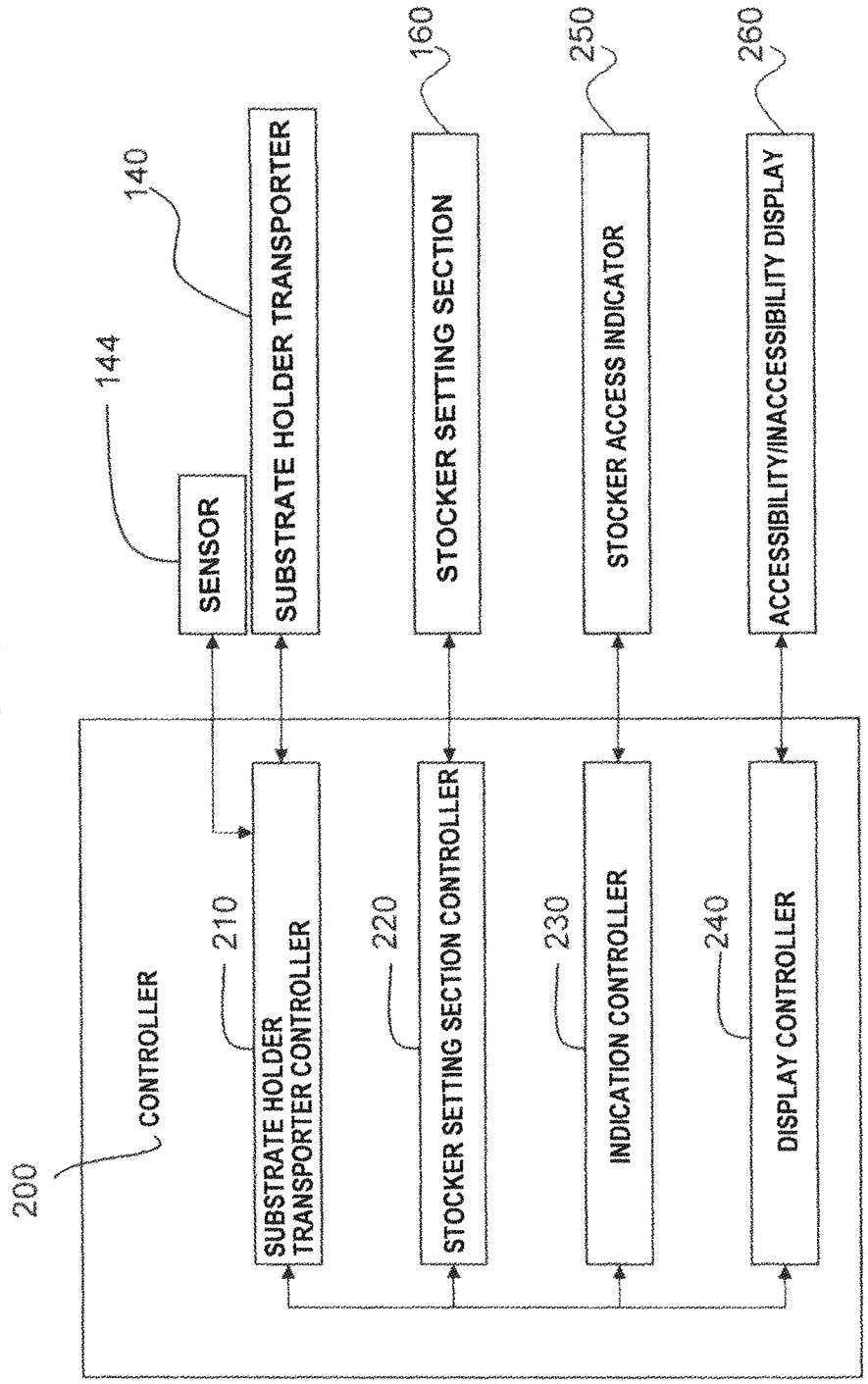
FIG. 30 is a block diagram showing connections between a controller of the plating apparatus, the substrate holder transporter, the stocker setting section, a stocker access indicator, and an accessibility/inaccessibility display.

FIG. 30 is a block diagram showing connections between a controller 200 of the plating apparatus, the substrate holder transporter 140, the stocker setting section 160, a stocker access indicator 250, and an accessibility/inaccessibility display 260. As shown in FIG. 30, the plating apparatus includes the controller 200 which includes therein a substrate holder transporter controller 210, a stocker setting section controller 220, an indication controller 230, and a display controller 240.

The substrate holder transporter controller 210 monitors and controls the substrate holder transporter 140, and receives a detected signal from the sensor 144 (see FIGS. 4A. through 4C) mounted on the substrate holder transporter 140. The stocker setting section controller 220 monitors and controls various components of the stocker setting section 160, including the door 161, the door switch 165*b* for locking the door 161, the shutter 162, and the shutter 165*a* for locking the shutter 162.

The indication controller 230 receives an access indication from the stocker access indicator 250. The display controller 240 controls the accessibility/inaccessibility display 260 to display accessibility or inaccessibility to the stocker setting section 160 based on the information about whether the stocker setting section 160 can be accessed or not, which is received from the stocker setting section controller 220 and the substrate holder transporter controller 210.

The stocker access indicator (hereinafter referred to as "indicator") 250 indicates to the indication controller 230 the start of a process of taking the wagon-type stocker 150 out of the stocker setting section 160 and the end of a process of returning the wagon-type stocker 150 into the stocker setting section 160, and controls the substrate holder transporter controller 210 to limit access to the stocker setting section 160 by the substrate holder transporter 140. The indicator 250 may be in the form of a touch-panel button for entering a processing command or a dedicated button provided near the rear surface of the plating apparatus. The indicator 250 indicates access to the wagon-type stocker 150 to the indication controller 230, which transports the indication to the substrate holder transporter controller 210. The substrate holder transporter controller 210 limits access to the stocker setting section 160 by the substrate holder transporter 140.

When the indicator 250 indicates impending access to the wagon-type stocker 150 to the indication controller 230, the indication controller 230 sends the indication to the stocker setting section controller 220. The stocker setting section controller 220 determines accessibility or inaccessibility to the stocker setting section 160 based on the status of the stocker setting section 160 and the operation status of the substrate holder transporter 140 which is grasped by the substrate holder transporter controller 210. The accessibility/inaccessibility display 260 indicates the determined accessibility or inaccessibility to the operator.

The accessibility/inaccessibility display 260 may comprise a lamp, a GUI screen image, or a buzzer to indicate accessibility or inaccessibility to the operator or apparatus user. The accessibility/inaccessibility display 260 may display information as to whether the wagon-type stocker 150 is installed in the stocker setting section 160 or not to allow the operator to recognize easily whether the stocker setting section 160 is accessible or not and the status of the stocker setting section 160.

While the substrate holder transporter 140 is operating to store a substrate holder 110 in the wagon-type stocker 150, access to the wagon-type stocker 150 is prohibited, and the stocker setting section controller 220 judges inaccessibility to the wagon-type stocker 150. When the stocker setting section controller 220 judges inaccessibility to the wagon-type stocker 150, the door 161 is securely locked against accidental opening.

The door 161 is locked by a switch 165 which is made up of a combination of the shutter switch 165*a* for locking the shutter 162 and the door switch 165*b* for locking the door 161.

To provide against a situation in which although the shutter 162 is open, the door 161 is opened for some reasons such as a failure of the door switch 165*b* for locking the door 161, the door 161 may have an opening and closing sensor, not shown, and an interlock mechanism may be used to detect when the door 161 is opened and generate an error signal based on a signal from the opening and closing sensor.

In this embodiment, the sensor 144 (see FIGS. 4A through 4C) mounted on the substrate holder transporter 140 is also used as a sensor for detecting the number and positions of the substrate holders 110 stored in the wagon-type stocker 150. When the plating apparatus is switched on and initialized, the sensor 144 detects the number and positions of the substrate holders 110 stored in the wagon-type stocker 150. Subsequently, according to a command for starting a plating process, the substrate holder transporter 140 removes a substrate holder 110 from the wagon-type stocker 150. The controller 200 of the plating apparatus grasps at all times which substrate holder 110 has been taken from the wagon-type stocker 150. Accordingly, immediately before the wagon-type stocker 150 is removed from the stocker setting section 160, the controller 200 of the plating apparatus can recognize how many substrate holders 110 are stored in the wagon-type stocker 150. In addition, the substrate holders 110 may be detected and checked again immediately before the wagon-type stocker 150 is removed from the stocker setting section 160.

Then, the wagon-type stocker 150 is removed from the plating apparatus, the substrate holders 110 stored therein are serviced, and the wagon-type stocker 150 is returned to the plating apparatus. When the wagon-type stocker 150 is returned to the stocker setting section 160, the sensor 144 detects the substrate holders 110 in the wagon-type stocker 150. At this time, the sensor 144 may issue a warning signal if the number of substrate holders 110 detected after wagon-type stocker 150 is returned to the stocker setting section 160 is greater than the number of substrate holders 110 detected before the wagon-type stocker 150 is taken from the stocker setting section 160. The sensor 144 issues a warning signal because the increased number of substrate holders 110 means that the wagon-type stocker 150 does not have a space to which the substrate holder 110 used in the plating apparatus is to return.

When the wagon-type stocker 150 is removed from the plating apparatus, a substrate holder 110 stored therein is serviced, and then the serviced substrate holder 110 is returned to the wagon-type stocker 150, the serviced substrate holder 110 may be stored in a location, which is different from the original location from which it was removed, in the wagon-type stocker 150. At this time, when the serviced substrate holder 110 is returned to the wagon-type stocker 150, the substrate holders 110 are detected, as described above, and the location information of the substrate holders 110 in the wagon-type stocker 150 is updated. Thus, when the substrate holder transporter 140 returns a substrate holder 110 to the wagon-type stocker 150, if the substrate holder 110 is to be stored in a location which has already been occupied by another substrate holder 110, then the sensor 144 detects the substrate holder 110 which has already occupied the location, and generates a signal for stopping the substrate holder transporter 140 from returning the substrate holder 110. The sensor 144 may not necessarily be installed in the substrate holder transporter 140, but may be installed in any position in which it is capable of detecting the number and positions of the substrate holders 110 stored in the wagon-type stocker 150.

In order to take the wagon-type stocker 150 reliably into and out of the stocker setting section 160, the substrate holder transporter 140 is prevented from moving to a position above the stocker setting section 160 when the wagon-type stocker 150 is taken into and out of the stocker setting section 160. The substrate holder transporter 140 is prevented from moving to a position above the stocker setting section 160 by a driver for a servomotor which moves the substrate holder transporter 140, for example.

A procedure for placing the wagon-type stocker 150 into and removing the wagon-type stocker 150 from the stocker setting section 160 will be described below with reference to FIGS. 31A through 31E. FIGS. 31A through 31E are perspective views schematically showing a procedure for placing the wagon-type stocker 150 into and removing the wagon-type stocker 150 from the stocker setting section 160.

Figure 31:
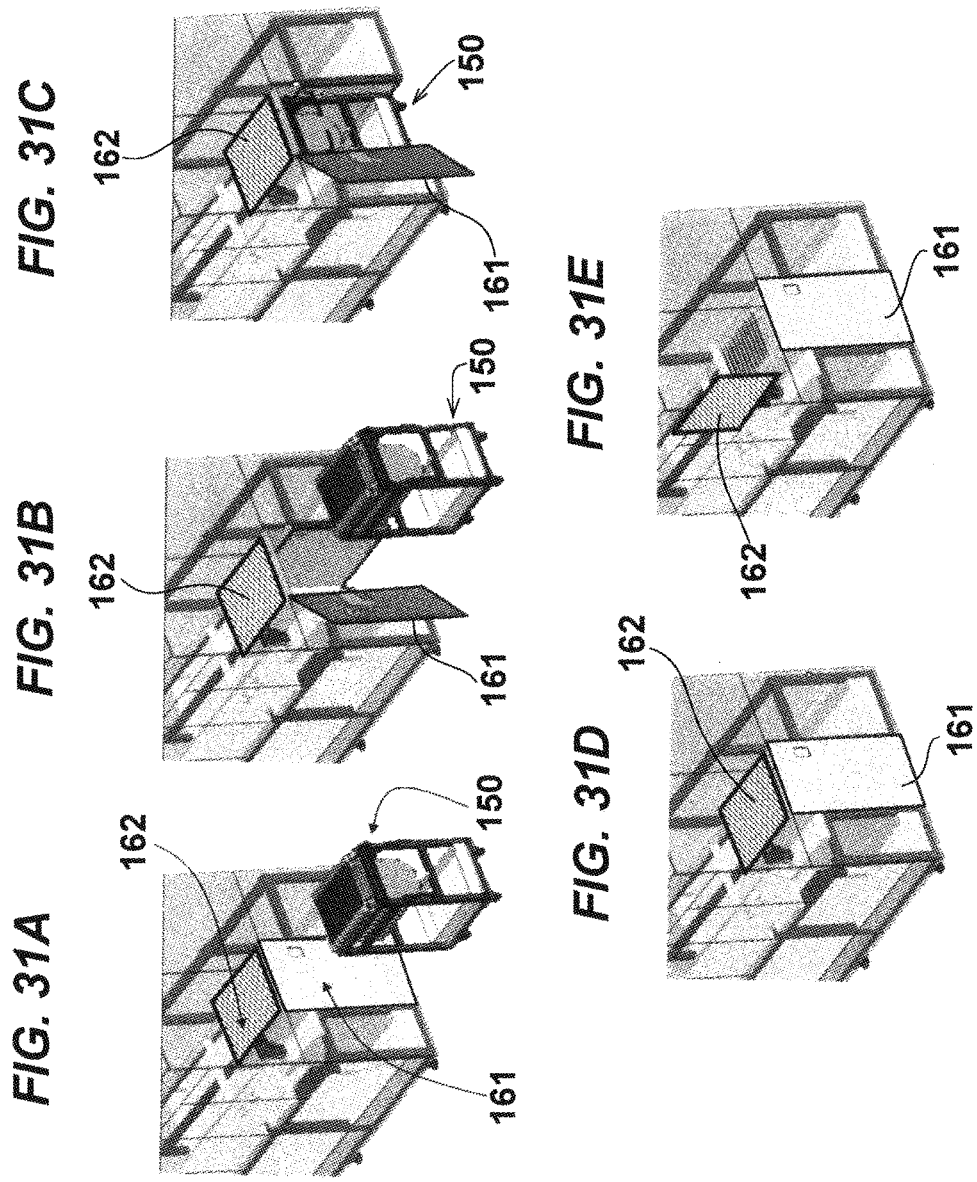
FIGS. 31A through 31E are perspective views schematically showing a procedure for placing the wagon-type stocker into and removing the wagon-type stocker from the stocker setting section.

First, as shown in FIG. 31A, the wagon-type stocker 150 is moved to a position near the door 161 of the stocker setting section 160. Then, as shown in FIG. 31B, the door 161 is opened. The door 161 may be manually opened or may be automatically opened when a sensor detects the approaching wagon-type stocker 150. Then, as shown in FIG. 31C, the wagon-type stocker 150 is moved into a predetermined position in the stocker setting section 160. As shown in FIG. 31D, it is confirmed that the wagon-type stocker 150 is placed in the predetermined position in the stocker setting section 160, after which the door 161 is closed. Then, as shown in FIG. 31E, after it is confirmed that the wagon-type stocker 150 is placed in the predetermined position in the stocker setting section 160, and the door 161 is closed, the shutter 162 in the stocker setting section 160 is opened. The stocker setting section 160 may have a display for indicating that the shutter 162 is opened and the wagon-type stocker 150 is ready for a plating process.

The wagon-type stocker 150 is removed from the stocker setting section 160 as follows:

First, as shown in FIG. 31D, it is confirmed that the door 161 is closed, and then the shutter 162 is closed. Then, as shown in FIG. 31C, the door 161 is opened. The wagon-type stocker 150 now starts to move out of the stocker setting section 160. As shown in FIG. 31B, the wagon-type stocker 150 is moved out of the stocker setting section 160 until the wagon-type stocker 150 is completely separated from the stocker setting section 160. After it is confirmed that the wagon-type stocker 150 is completely separated from the stocker setting section 160, the door 161 is closed, as shown in FIG. 31A.

Figure 32:
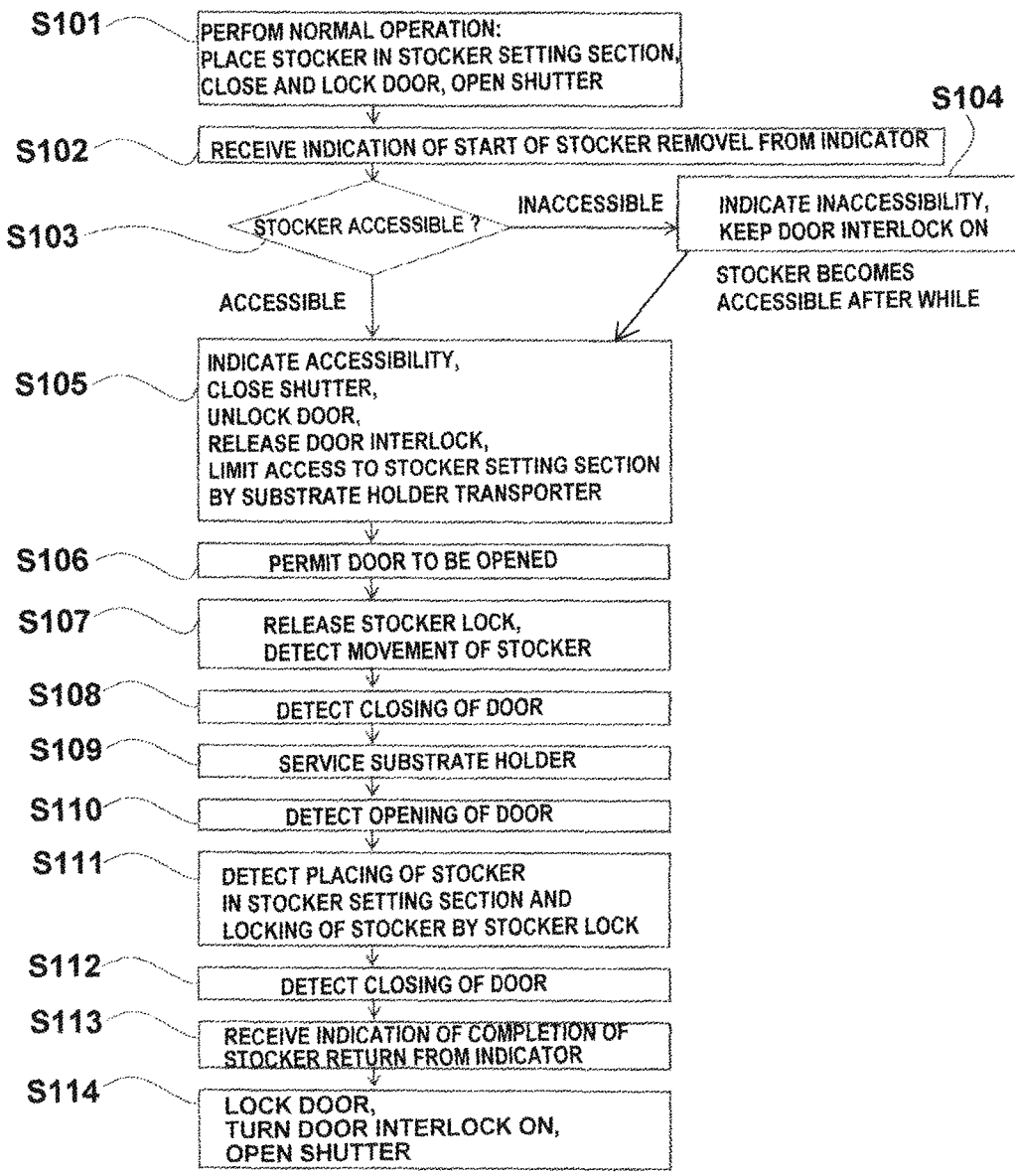
FIG. 32 is a flowchart of a procedure for placing the wagon-type stocker into and removing the wagon-type stocker from the stocker setting section while the plating apparatus is in operation.
Figure 33:
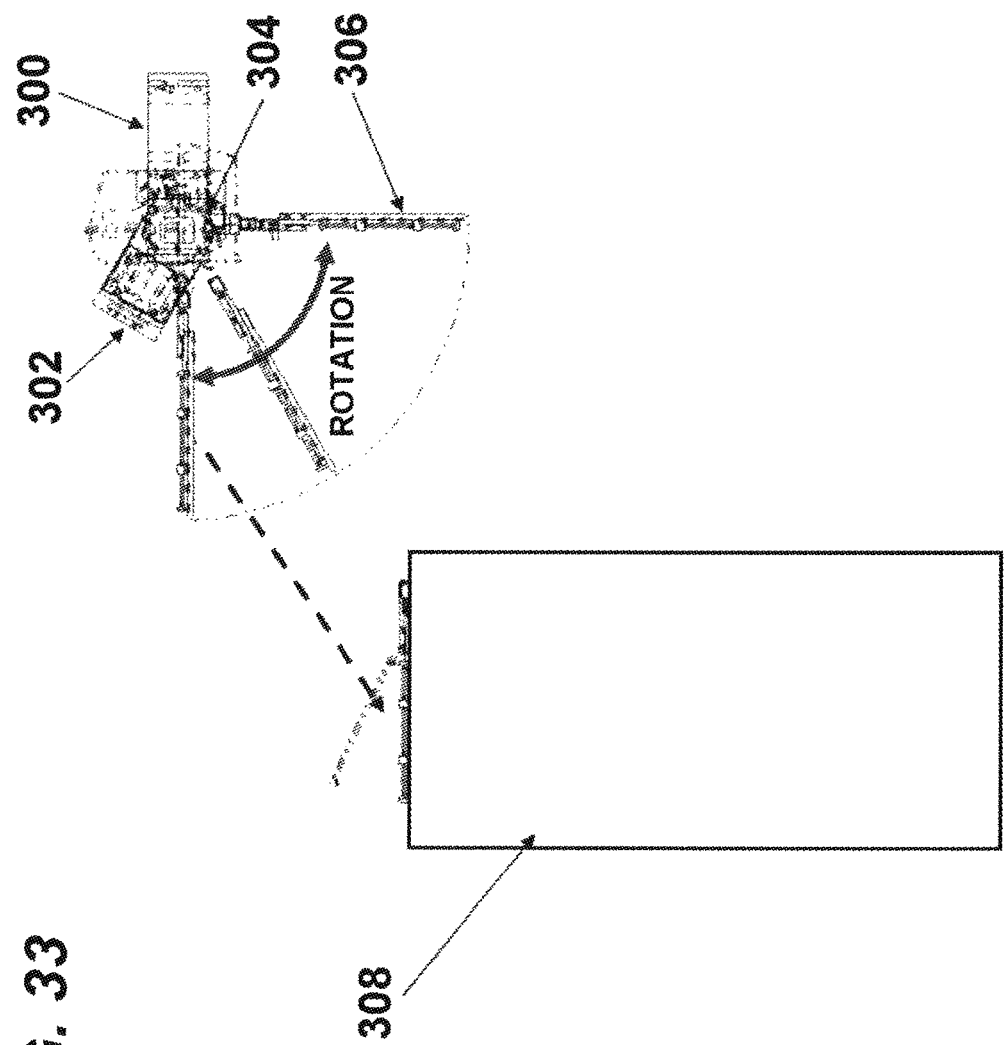
FIG. 33 is a schematic view showing a mechanism for rotating a substrate holder provided in a conventional plating apparatus.
Figure 34:
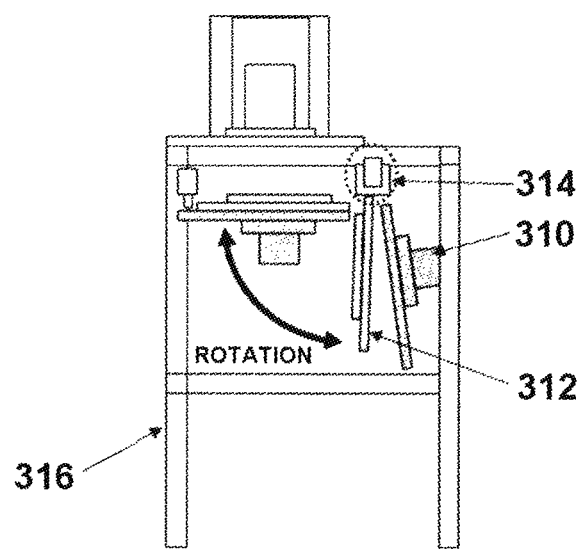
FIG. 34 is a schematic view showing another mechanism for rotating a substrate holder provided in another conventional plating apparatus.

A procedure for placing the wagon-type stocker 150 into and removing the wagon-type stocker 150 from the stocker setting section 160 while the plating apparatus is in operation will be described below with reference to FIG. 32. FIG. 32 is a flowchart of the procedure, wherein successive steps are denoted by reference numerals with a prefix "S".

While the plating apparatus is in normal operation, the wagon-type stocker 150 is placed in the stocker setting section 160, the door 161 is closed and locked, and the shutter 162 is open (step S101).

When it is necessary to remove the wagon-type stocker 150 from the stocker setting section 160 for servicing the substrate holders 110 in the wagon-type stocker 150, for example, the indicator 250 sends an indication of the start of a process of taking the wagon-type stocker 150 out of the stocker setting section 160, and the indication controller 230 receives the indication from the indicator 250 (step S102). When the indication controller 230 receives the indication from the indicator 250, the substrate holder transporter controller 210 confirms the status of the substrate holder transporter 140. The stocker setting section controller 220 determines whether the wagon-type stocker 150 is accessible or inaccessible based on the status of the substrate holder transporter 140 which is confirmed by the substrate holder transporter controller 210, e.g., whether the substrate holder transporter 140 is removing a substrate holder 110 from the wagon-type stocker 150 or not or whether the substrate holder transporter 140 is placing a substrate holder 110 into the wagon-type stocker 150 or not (step S103).

If the stocker setting section controller 220 judges that the wagon-type stocker 150 is inaccessible, then the display controller 240 controls the accessibility/inaccessibility display 260 to indicate that the wagon-type stocker 150 is inaccessible (step S104). At this time, the door 161 remains locked and cannot be opened. If the status of the substrate holder transporter 140 is subsequently changed after a while and the stocker setting section controller 220 judges that the wagon-type stocker 150 is accessible, then control goes to step S105.

When the stocker setting section controller 220 judges that the wagon-type stocker 150 is accessible, the display controller 240 controls the accessibility/inaccessibility display 260 to indicate that the wagon-type stocker 150 is accessible (step S105). The shutter 162 is closed and locked by the switch 165a, the door 161 is released by the switch 165b, releasing the interlock mechanism. The stocker setting section controller 220 now permits the door 161 to be opened (step S106).

When the door 161 is opened to allow access to the wagon-type stocker 150, the stocker locks or latches 159 can be manually released. Removal of the wagon-type stocker 150 from the stocker setting section 160 is detected by the stocker setting section controller 220 through a sensor or the like mounted in the stocker setting section 160 (step S107).

After the wagon-type stocker 150 is removed from the stocker setting section 160, the door 161 is closed, and the closing of the door 161 is detected by the stocker setting section controller 220 (step S108). The substrate holders 110 in the wagon-type stocker 150 removed from the stocker setting section 160 are taken out of the wagon-type stocker 150 and serviced (step S109). When the servicing of the substrate holders 110 is completed, the door 161 is opened to bring the wagon-type stocker 150 back into the stocker setting section 160. The opening of the door 161 is detected by the stocker setting section controller 220 (step S110).

The wagon-type stocker 150 is placed in the stocker setting section 160, and then locked by the stocker locks or latches 159. The locking of the wagon-type stocker 150 in the stocker setting section 160 by the stocker locks or latches 159 is detected by the stocker setting section controller 220 (step S111). After the wagon-type stocker 150 is placed in the stocker setting section 160 and locked therein by the stocker locks or latches 159, the door 161 is closed. The closing of the door 161 is detected by the stocker setting section controller 220 (step S112).

When the indicator 250 sends an indication of the completion of the installation of the wagon-type stocker 150, the indication controller 230 receives the indication from the indicator 250 (step S113). The stocker setting section controller 220 controls the switch 165b to lock the door 161 and also controls the switch 165a to release and open the shutter 162 (step S114). After the shutter 162 was closed in step S105, the shutter 162 has remained closed to block the ambient air against entry until step S114.

In this embodiment, the wagon-type stocker 150 stores substrate holders 110 therein. If the plating apparatus is an electroplating apparatus for performing electroplating, then the wagon-type stocker 150 may store anode holders to be used in plating tanks therein, or may store both substrate holders 110 and anode holders. In a case where substrate holders 110 and anode holders are stored in the wagon-type stocker 150, the substrate holder storage area for storing substrate holders 110 in the wagon-type stocker 150 also functions as an anode holder storage area for storing anode holders.

An anode holder, which holds an anode, is placed in a plating solution in a plating tank. In the plating tank, the anode held by the anode holder and a substrate 500 held by a substrate holder 110 are disposed in confronting relation to each other with their surfaces lying parallel to each other. When a plating power source supplies an electric current between the anode and the substrate 500, the surface to be plated of the substrate 500, which is exposed from the substrate holder 110, is electroplated. The anode holder, which is similar in outer profile to the substrate holder 110 shown in FIG. 3, includes a main body, a hanger, and a handlebar, and holds the anode on the main body, for example. The anode held by the anode holder is electrically connected to power feeder contacts on the hanger in substantially the same manner as shown in FIG. 3.

The anode holder is placed into the wagon-type stocker as follows: First, the anode holder is pulled upwardly from the plating tank. The anode holder usually has an anode back for preventing anode slime from being scattered. Therefore, when the anode holder is pulled upwardly from the plating tank, the plating solution continues dripping from the anode back for minutes. After plating solution droplets start dripping at sufficiently spaced intervals, the anode holder is rinsed in a rinsing tank. When most rinsing water is removed from the anode holder, the anode holder is brought back into the wagon-type stocker 150. Since the plating solution still continues to drip from the anode holder even after the anode holder is stored in the wagon-type stocker 150, the drain pan 158 in the lower portion or on the bottom of the wagon-type stocker 150 receives and holds the dripped plating solution.

The wagon-type stocker 150, which stores anode holders, offers the same advantages as those of the wagon-type stocker 150, which stores substrate holders 110. Specifically, since the wagon-type stocker 150 can be pulled out of the plating apparatus and anode holders can be taken into and out of the wagon-type stocker 150 outside of the plating apparatus, the burden on the operator is smaller than if anode holders are taken into and out of the wagon-type stocker manually or by a hoist within the plating apparatus.

In this embodiment, the wagon-type stocker 150 is used as a stocker. A stocker configured to move into and out of a stoker setting section along rails, for example, may be used instead of the wagon-type stocker 150.

Although certain preferred embodiments of the present invention have been shown and described in detail, it should be understood that various changes and modifications may be made therein without departing from the scope of the appended claims.

What is claimed is:

1. A plating apparatus comprising:
   a table for placing a substrate holder horizontally thereon, the substrate holder capable of detachably holding a substrate;
   a plating section for holding a plating solution therein for plating the substrate, held by the substrate holder, by immersing the substrate in a vertical plane in the plating solution; and
   a substrate holder transporter for transporting the substrate holder between the table and the plating section, the substrate holder transporter including a holding portion for holding the substrate holder,
   wherein the table has a horizontally moving mechanism which is horizontally movable while supporting a lower end of the substrate holder, and
   wherein the substrate holder transporter includes a lifting and lowering mechanism for converting an attitude of the substrate holder from a vertical state into a horizontal state or from a horizontal state into a vertical state by vertically moving the holding portion as the horizontally moving mechanism moves horizontally, with the lower end of the substrate holder being supported by the horizontally moving mechanism.

2. A plating apparatus according to claim 1, further comprising:
   a substrate holder detector for detecting whether the substrate holder transporter is holding the substrate holder or not.

3. A plating apparatus according to claim 2, further comprising:
   a lifting and lowering mechanism controller for stopping operation of the lifting and lowering mechanism if the substrate holder detector detects that the holding portion is not holding the substrate holder.

4. A plating apparatus according to claim 1, wherein the substrate holder includes a round handlebar, and the holding portion holds the round handlebar.

5. A plating apparatus according to claim 4, wherein the holding portion is of a shape for rotatably supporting the round handlebar.

6. A plating apparatus according to claim 1, wherein the lower end of the substrate holder has a semicircular cross-sectional shape when viewed from a direction perpendicular to both a movement direction of the horizontally moving mechanism and a vertical movement direction of the holding portion.

7. A plating apparatus according to claim 1, wherein the horizontally moving mechanism is biased in a direction to lower the holding portion by a weight suspended from the horizontally moving mechanism.

8. A plating apparatus according to claim 1, wherein the substrate holder transporter includes a damper for preventing the substrate holder from swinging while the substrate holder is being transported.

9. A plating apparatus according to claim 1, wherein the horizontally moving mechanism is horizontally movable in a direction in which the substrate holder transporter transports the substrate holder.

10. A plating apparatus according to claim 1, wherein the horizontally moving mechanism is configured to keep supporting the lower end of the substrate holder while the lifting and lowering mechanism converts the attitude of the substrate holder from a vertical state into a horizontal state or from a horizontal state into a vertical state.

* * * * *

UNITED STATES PATENT AND TRADEMARK OFFICE
CERTIFICATE OF CORRECTION

PATENT NO.         : 9,991,145 B2
APPLICATION NO.    : 15/630119
DATED              : June 5, 2018
INVENTOR(S)        : Yoshio Minami Page 1 of 1

It is certified that error appears in the above-identified patent and that said Letters Patent is hereby corrected as shown below:

In the Claims

Please replace the text of Column 36, Lines 50-53 with the following:
8. A plating apparatus according to claim 1, wherein the substrate holder transporter includes a clamper for preventing the substrate holder from swinging while the substrate holder is being transported.

Signed and Sealed this
Fourth Day of December, 2018

Andrei Iancu
*Director of the United States Patent and Trademark Office*